(12) United States Patent
Fukuzumi et al.

(10) Patent No.: US 7,084,447 B2
(45) Date of Patent: Aug. 1, 2006

(54) MAGNETIC RANDOM ACCESS MEMORY HAVING MAGNETORESISTIVE ELEMENT

(75) Inventors: Yoshiaki Fukuzumi, Yokohama (JP); Tadashi Kai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/007,210

(22) Filed: Dec. 9, 2004

(65) Prior Publication Data

US 2006/0017082 A1    Jan. 26, 2006

(30) Foreign Application Priority Data

Jul. 22, 2004    (JP) .............................. 2004-214755

(51) Int. Cl.
*H01L 29/72* (2006.01)
(52) U.S. Cl. ...................... 257/295; 257/296; 365/158
(58) Field of Classification Search ................. 257/295
See application file for complete search history.

(56) References Cited

U.S. PATENT DOCUMENTS

| | | | |
|---|---|---|---|
| 6,545,906 B1 | 4/2003 | Savtchenko et al. | |
| 6,611,405 B1 * | 8/2003 | Inomata et al. | .......... 360/324.2 |
| 6,730,949 B1 * | 5/2004 | Kishi et al. | .................. 257/295 |
| 6,956,763 B1 * | 10/2005 | Akerman et al. | ........... 365/158 |
| 6,956,764 B1 * | 10/2005 | Engel et al. | ................. 365/158 |
| 2004/0085681 A1 | 5/2004 | Kai et al. | |

\* cited by examiner

*Primary Examiner*—David Nelms
*Assistant Examiner*—Dao H. Nguyen
(74) *Attorney, Agent, or Firm*—Oblon, Spivak, McClelland, Maier & Neustadt, P.C.

(57) ABSTRACT

A magnetic random access memory includes a magnetoresistive element which has a recording layer, a fixed layer, and an intermediate nonmagnetic layer, the recording layer comprising a first ferromagnetic layer formed on the intermediate nonmagnetic layer, a first nonmagnetic layer formed on the first ferromagnetic layer, a second ferromagnetic layer formed on the first nonmagnetic layer and magnetically coupled with the first ferromagnetic layer by first magnetic coupling, a second nonmagnetic layer formed on the second ferromagnetic layer, and a third ferromagnetic layer formed on the second nonmagnetic layer and magnetically coupled with the second ferromagnetic layer by second magnetic coupling, wherein one of a state in which the first magnetic coupling is anti-ferromagnetic coupling and the second magnetic coupling is ferromagnetic coupling, and a state in which the first magnetic coupling is ferromagnetic coupling and the second magnetic coupling is anti-ferromagnetic coupling is obtained.

20 Claims, 15 Drawing Sheets

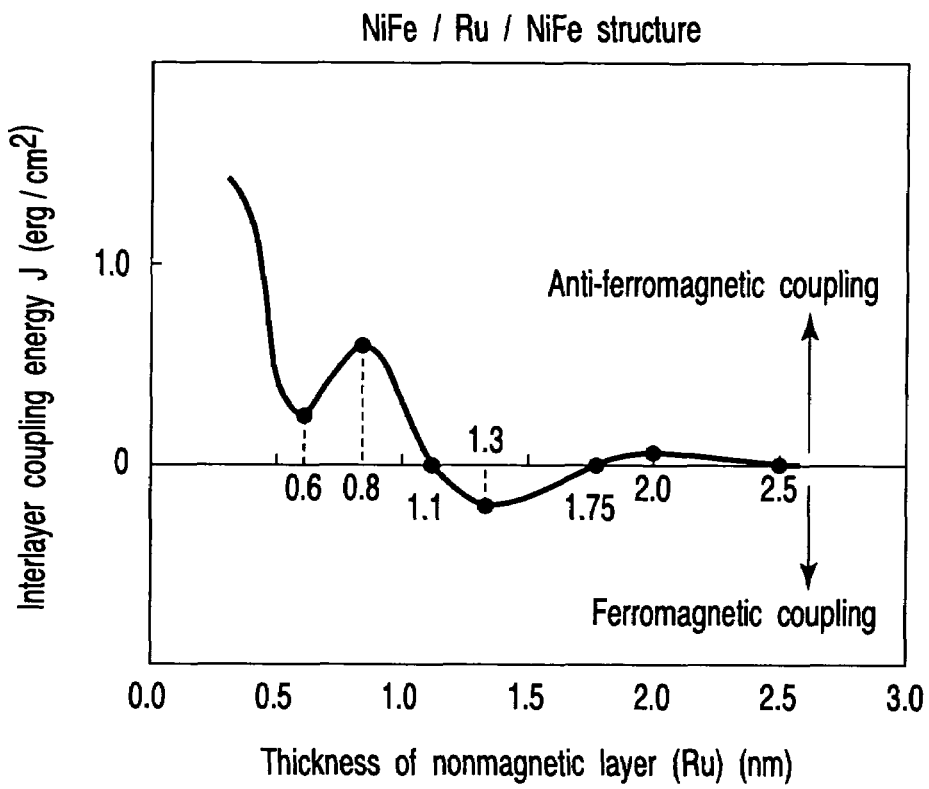
F I G. 4
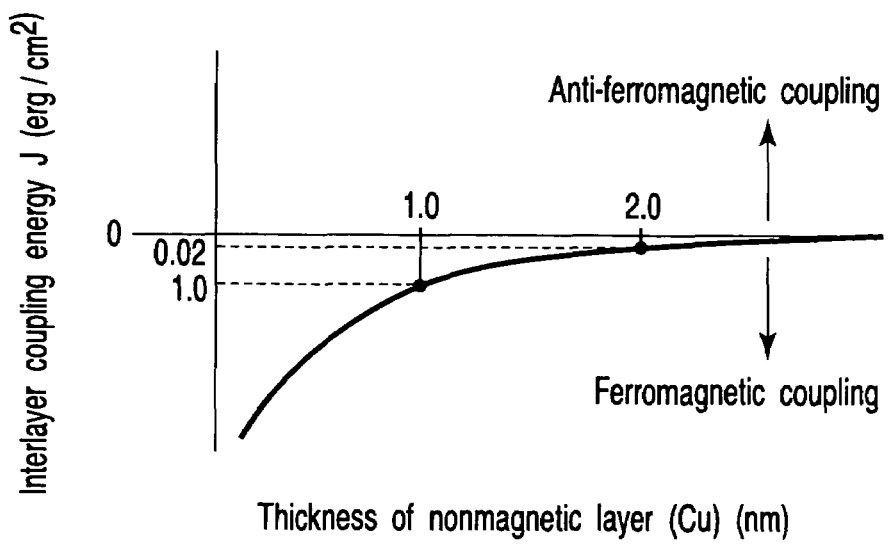
F I G. 5

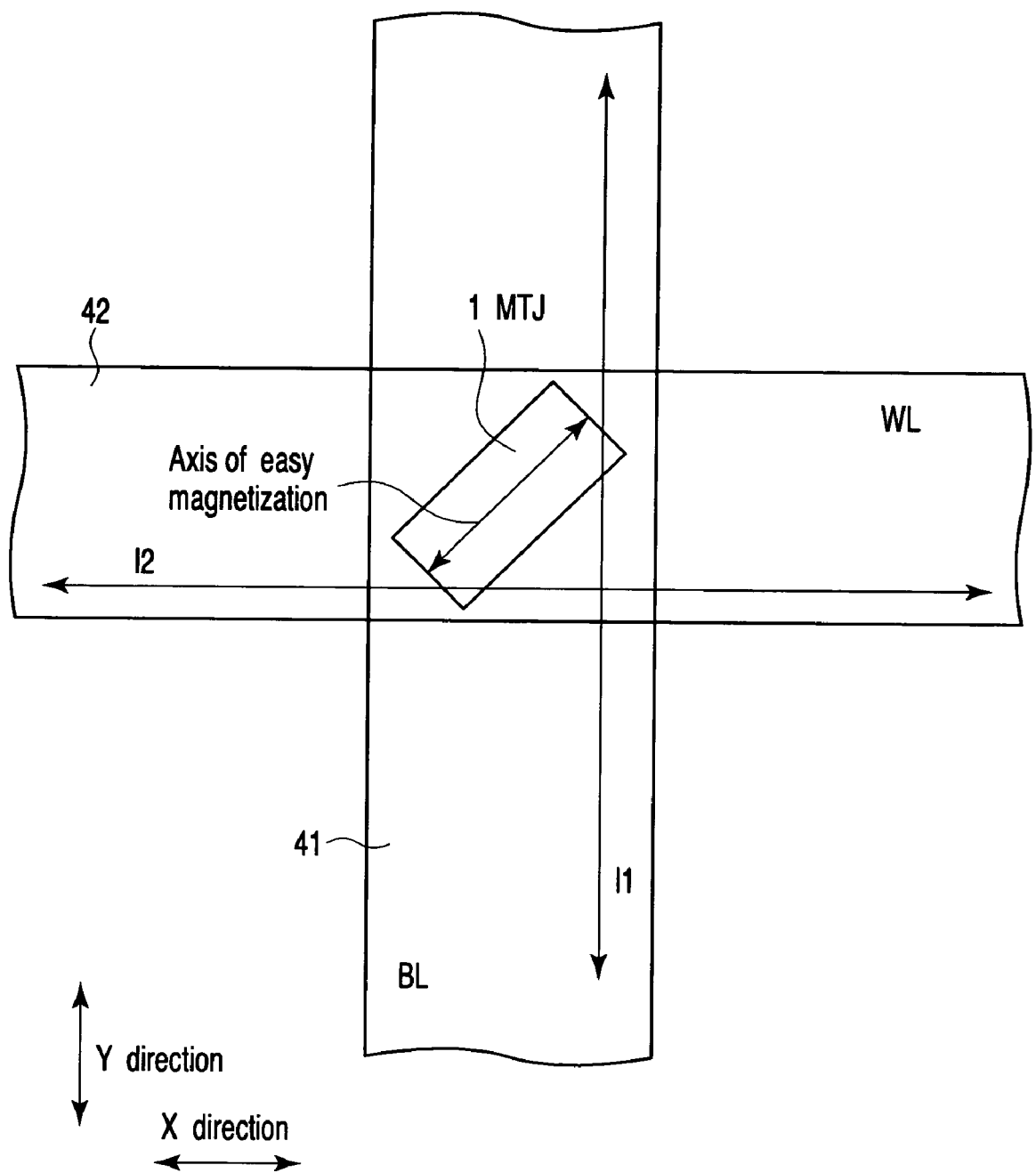
F I G. 11

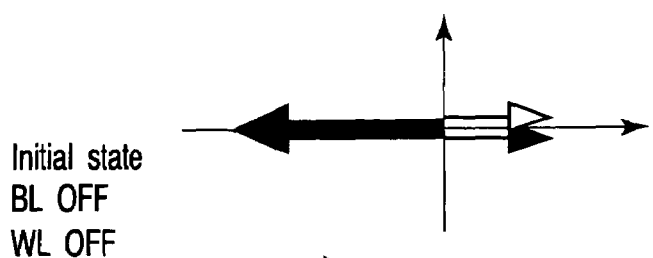

FIG. 15A — Initial state BL OFF WL OFF

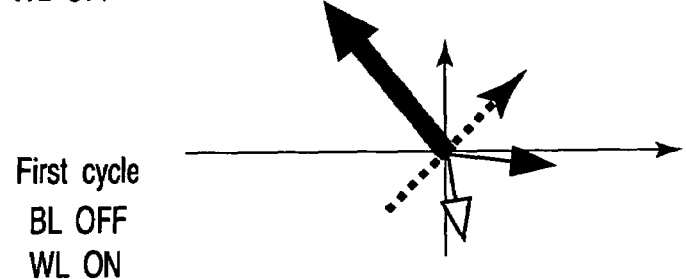

FIG. 15B — First cycle BL OFF WL ON

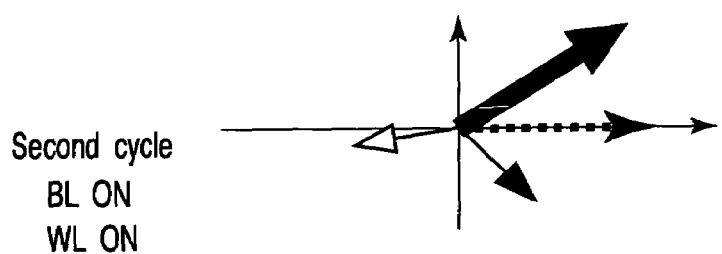

FIG. 15C — Second cycle BL ON WL ON

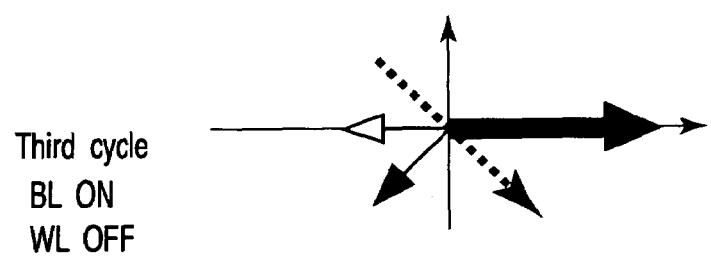

FIG. 15D — Third cycle BL ON WL OFF

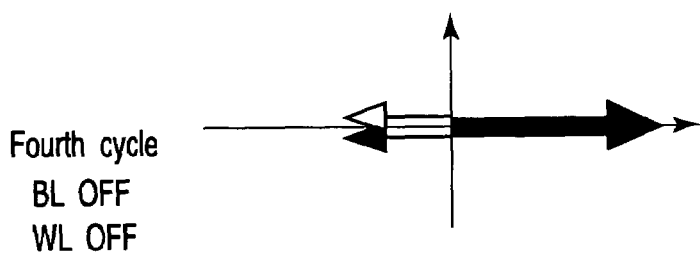

FIG. 15E — Fourth cycle BL OFF WL OFF

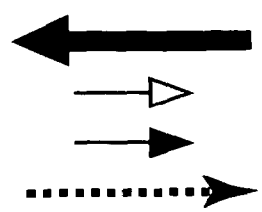

⬅ Magnetization direction of third ferromagnetic layer
▷ Magnetization direction of second ferromagnetic layer
→ Magnetization direction of first ferromagnetic layer
┈▶ Composed magnetization direction of recording layer

US 7,084,447 B2

MAGNETIC RANDOM ACCESS MEMORY HAVING MAGNETORESISTIVE ELEMENT

CROSS-REFERENCE TO RELATED APPLICATIONS

This application is based upon and claims the benefit of priority from prior Japanese Patent Application No. 2004-214755, filed Jul. 22, 2004, the entire contents of which are incorporated herein by reference.

BACKGROUND OF THE INVENTION

1. Field of the Invention

The present invention relates to an MRAM (Magnetic Random Access Memory) having a magnetoresistive element.

2. Description of the Related Art

In recent years, an MRAM (Magnetic Random Access Memory) using a TMR (Tunnel Magneto-Resistance) effect has been proposed as a kind of semiconductor memory.

In each memory cell of an MRAM, an MTJ (Magnetic Tunneling Junction) element serving as an information storage element is formed at the interconnection between a bit line and a word line. In a data write mode, a current is supplied to each of a selected bit line and a selected word line. Data is written in the MTJ element of the selected cell located at the intersection between the selected bit line and the selected word line by a composed magnetic filed generated by the currents. In a data read mode, a read current is supplied to the MTJ element of a selected cell so that "1" or "0" data is read out in accordance with a resistance change in the magnetized state of the MTJ element.

In a data write in such an MRAM, the write current field may influence even a semi-selected cell which is selected in correspondence with only one of the selected bit line and selected word line. This may cause a write error in the semi-selected cell so that a problem of disturbance may be posed. Avoiding the problem of disturbance is regarded as one of most significant challenges in developing an MRAM.

As a solution to the problem of disturbance, a toggle MRAM using two recording layers anti-ferromagnetically coupled with each other has been proposed (e.g., U.S. Pat. No. 6,545,906). In this toggle MRAM, however, the write current value is large impractically. As described above, in the conventional MRAM, it is difficult to reduce the write current while suppressing any write error.

BRIEF SUMMARY OF THE INVENTION

According to an aspect of the present invention, there is provided a magnetic random access memory including a magnetoresistive element which has a recording layer, a fixed layer, and an intermediate nonmagnetic layer arranged between the recording layer and the fixed layer, the recording layer comprising a first ferromagnetic layer which is formed on the intermediate nonmagnetic layer, a first nonmagnetic layer which is formed on the first ferromagnetic layer, a second ferromagnetic layer which is formed on the first nonmagnetic layer and magnetically coupled with the first ferromagnetic layer via the first nonmagnetic layer by first magnetic coupling, a second nonmagnetic layer which is formed on the second ferromagnetic layer, and a third ferromagnetic layer which is formed on the second nonmagnetic layer and magnetically coupled with the second ferromagnetic layer via the second nonmagnetic layer by second magnetic coupling, wherein one of a state in which the first magnetic coupling is anti-ferromagnetic coupling and the second magnetic coupling is ferromagnetic coupling, and a state in which the first magnetic coupling is ferromagnetic coupling and the second magnetic coupling is anti-ferromagnetic coupling is obtained.

BRIEF DESCRIPTION OF THE SEVERAL VIEWS OF THE DRAWING

FIG. 4 is a graph showing the relationship between the thickness of Ru and the interlayer coupling energy when the recording layer has an NiFe/Ru/NiFe structure in the MTJ element in the magnetic random access memory according to the first embodiment of the present invention;

FIG. 5 is a graph showing the relationship between the thickness of Cu and the interlayer coupling energy in the MTJ element according to the first embodiment of the present invention;

FIG. 11 is a plan view showing a memory cell of the magnetic random access memory according to the first embodiment of the present invention;

FIGS. 15A, 15B, 15C, 15D, and 15E are schematic views showing magnetization states in the cycles of the write operation shown in FIG. 14;

DETAILED DESCRIPTION OF THE INVENTION

Figure 1:
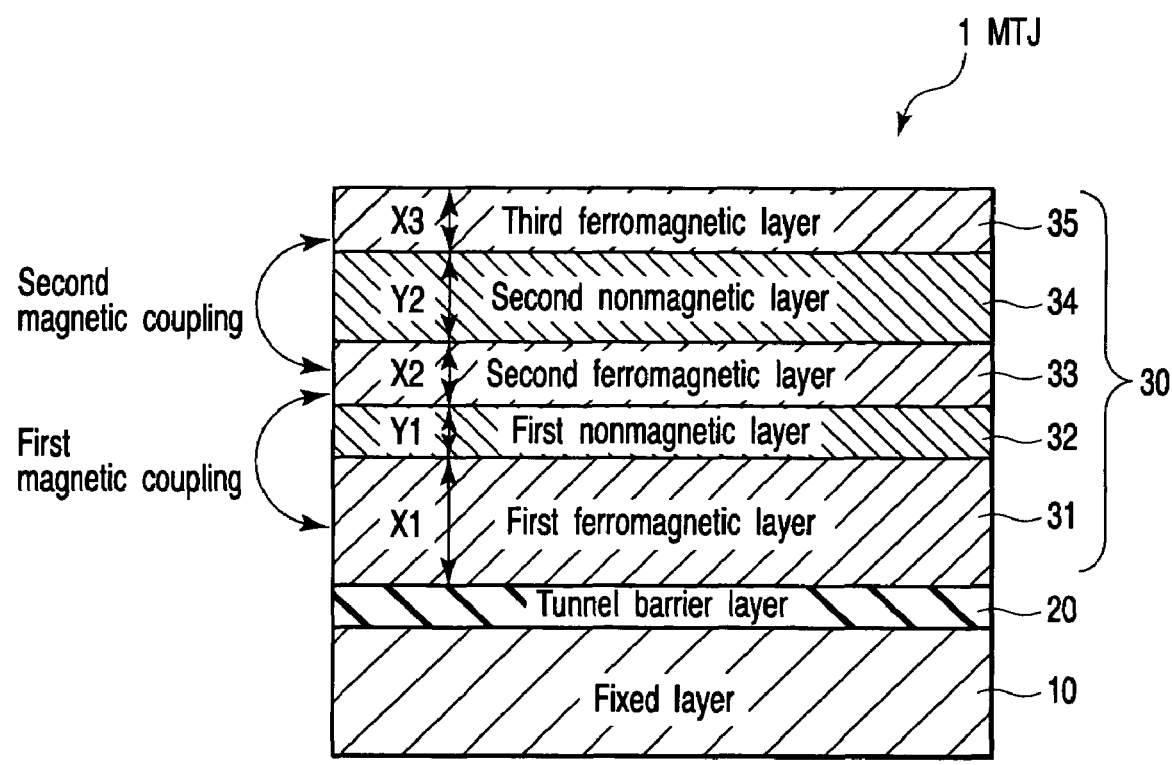
FIG. 1 is a sectional view showing an MTJ element in a magnetic random access memory according to the first embodiment of the present invention.

The embodiments of the present invention will be described below with reference to the accompanying drawing. In the description, the same reference numerals denote the common parts throughout the drawing.

[1] FIRST EMBODIMENT

In the first embodiment, the recording layer of an MTJ (Magnetic Tunneling Junction) element (magnetoresistive element) functioning as a storage element in an MRAM (Magnetic Random Access Memory) includes three ferromagnetic layers.

[1-1] Outline of MTJ Element

Figure 2:
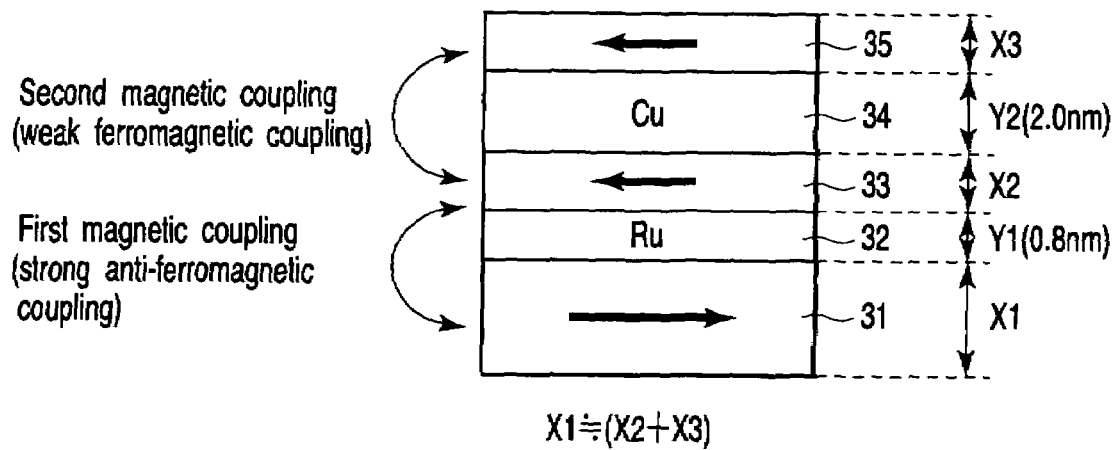
FIG. 2 is a schematic view showing the recording layer of the MTJ element in the magnetic random access memory according to the first embodiment of the present invention when the first magnetic coupling is anti-ferromagnetic coupling, and the second magnetic coupling is ferromagnetic coupling.
Figure 3:
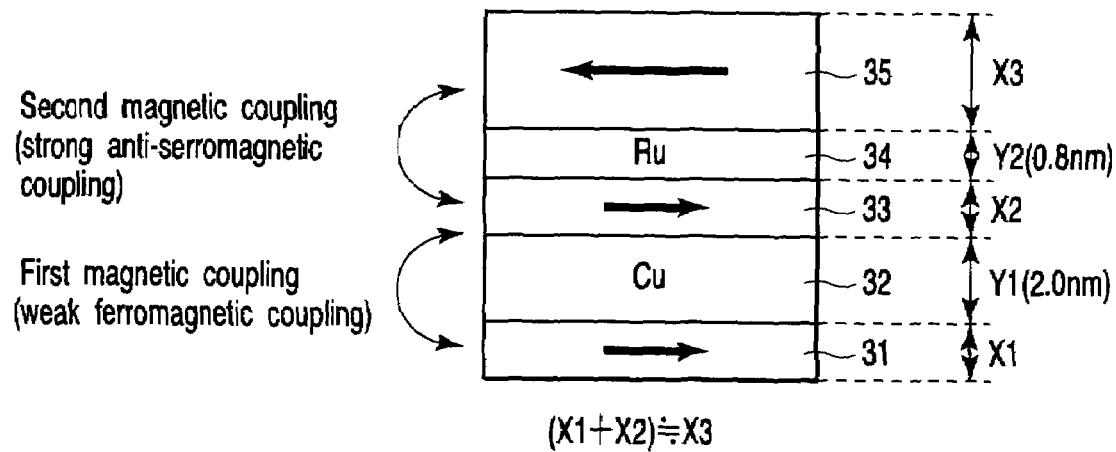
FIG. 3 is a schematic view showing the recording layer of the MTJ element in the magnetic random access memory according to the first embodiment of the present invention when the first magnetic coupling is ferromagnetic coupling, and the second magnetic coupling is anti-ferromagnetic coupling.

FIG. 1 is a sectional view showing an MTJ element in a magnetic random access memory according to the first embodiment of the present invention. FIGS. 2 and 3 are schematic views showing the magnetic coupling states of the recording layer included in the MTJ element according to the first embodiment of the present invention. The outline of the MTJ element of the magnetic random access memory according to the first embodiment of the present invention will be described below.

As shown in FIG. 1, an MTJ element 1 includes a fixed layer (pinning layer) 10 having fixed magnetization, a recording layer (free layer) 30 having rotatable magnetization, and a tunnel barrier layer (intermediate nonmagnetic layer) 20 sandwiched between the fixed layer 10 and the recording layer 30.

The recording layer 30 of the MTJ element 1 has a multilayered structure to be described below. Three, first to third ferromagnetic layers 31, 33, and 35 are formed. A first nonmagnetic layer 32 is inserted between the first ferromagnetic layer 31 and the second ferromagnetic layer 33. A second nonmagnetic layer 34 is inserted between the second ferromagnetic layer 33 and the third ferromagnetic layer 35.

The first ferromagnetic layer 31 and second ferromagnetic layer 33 are magnetically coupled via the first nonmagnetic layer 32 (to be referred to as first magnetic coupling hereinafter). The second ferromagnetic layer 33 and third ferromagnetic layer 35 are magnetically coupled via the second nonmagnetic layer 34 (to be referred to as second magnetic coupling hereinafter).

For the first and second magnetic coupling, two states are possible: (a) the first magnetic coupling is anti-ferromagnetic coupling, and the second magnetic coupling is ferromagnetic coupling (FIG. 2), and (b) the first magnetic coupling is ferromagnetic coupling, and the second magnetic coupling is anti-ferromagnetic coupling (FIG. 3).

In either of (a) and (b), preferably, the coupled field strength (interlayer coupling energy) in ferromagnetic coupling is low, and that in anti-ferromagnetic coupling is high. For example, the absolute value of the magnitude of magnetic interaction in ferromagnetic coupling is smaller than the absolute value of the magnitude of magnetic interaction in anti-ferromagnetic coupling. In addition, for example, the magnitude of magnetic interaction in ferromagnetic coupling is smaller than the magnitude of magnetic interaction in anti-ferromagnetic coupling by one or more orders of magnitude.

In ferromagnetic coupling, a stable state is obtained when the magnetization directions are parallel. In anti-ferromagnetic coupling, a stable state is obtained when the magnetization directions are anti-parallel.

[1-2] Materials of MTJ Element

FIG. 4 shows the relationship between the thickness of Ru and the interlayer coupling energy when the recording layer has an NiFe/Ru/NiFe structure in the MTJ element in the magnetic random access memory is according to the first embodiment of the present invention. FIG. 5 shows the relationship between the thickness of Cu and the interlayer coupling energy in the MTJ element according to the first embodiment of the present invention. The materials of the layers included in the MTJ element according to the first embodiment of the present invention will be described below.

(a) Nonmagnetic Layers

The first and second nonmagnetic layers 32 and 34 are preferably formed from, e.g., one of Cu, Ag, Au, Pt, Pd, Ta, Os, Re, Ru, Ir, and Rh, or an alloy containing them.

The first and second nonmagnetic layers 32 and 34 are made of, e.g., Ru, Ir, or Rh if the ferromagnetic layers on the upper and lower sides are to be strongly anti-ferromagnetically coupled or, e.g., Cu, Ag, Au, Pt, Pd, Ta, Os, or Re (preferably Cu, Ag, or Ta) if the ferromagnetic layers are to be weakly ferromagnetically coupled. Especially, Ru is preferably used for anti-ferromagnetic coupling, and Cu is preferably used for ferromagnetic coupling (FIGS. 2 and 3). The reason for this is as follows.

Referring to FIGS. 4 and 5, when a nonmagnetic layer made of Ru or Cu is sandwiched between two ferromagnetic layers, the magnetic coupling state of the two ferromagnetic layers changes depending on the thickness of the nonmagnetic layer. Referring to FIGS. 4 and 5, the positive side of an interlayer coupling energy J indicates anti-ferromagnetic coupling, and the negative side indicates ferromagnetic coupling.

For Ru, as shown in FIG. 4, the interlayer coupling energy J largely varies in accordance with a change in thickness of Ru and approaches 0 as the thickness of Ru increases. In Ru, the interlayer coupling energy J largely varies depending on the thickness so that both the ferromagnetic coupling state and the anti-ferromagnetic coupling state are generated. For example, when the Ru layer is relatively thin (e.g., 0.8 nm), the interlayer coupling energy J is large, and an anti-ferromagnetic coupling stats is obtained. However, when the Ru layer becomes thick, the magnetic coupling state changes between ferromagnetic coupling and anti-ferromagnetic coupling. The magnetic coupling state changes in accordance with a slight change in thickness of Ru. Hence, when the Ru layer is relatively thick, Ru becomes weak to thickness variations.

For the above-described reason, Ru is used as the material of a nonmagnetic layer which is to be formed thin rather than thick. Accordingly, stable strong anti-ferromagnetic coupling can be obtained.

On the other hand, for Cu, as shown in FIG. 5, when the Cu layer is very thin, the upper and lower ferromagnetic layers are coupled in a ferromagnetic coupling state by the large interlayer coupling energy J. Even when the thickness of Cu increases, the interlayer coupling energy J monotonically decreases and approaches 0 without any large variation, unlike in Ru. For this reason, Cu is highly resistant to thickness variations. Hence, a thick Cu layer (e.g., 2.0 nm) can arbitrarily be selected.

Even when the thickness of Cu changes, the magnetic coupling state of the upper and lower ferromagnetic layers remains ferromagnetic coupling without changing to anti-ferromagnetic coupling. Hence, Cu is an effective material to generate a ferromagnetic coupling state.

For the above-described reason, Cu is used as the material of a nonmagnetic layer which is to be formed thick to generate a ferromagnetic coupling state. Accordingly, stable weak ferromagnetic coupling can be obtained.

(b) Ferromagnetic Layers

The fixed layer 10 and first to third ferromagnetic layers 31, 33, and 35 are formed from, e.g., NiFe or CoFe. The fixed layer 10 and first to third ferromagnetic layers 31, 33, and 35 may be formed from Fe, Co, Ni, or an alloy thereof, magnetite having a high spin polarizability, an oxide such as $CrO_2$ or $RXMnO_{3-y}$ (R: rare earth, X: Ca, Ba, or Sr), or a Heusler alloy such as NiMnSb or PtMnSb. The magnetic materials may contain a small content of nonmagnetic element such as Ag, Cu, Au, Al, Mg, Si, Bi, Ta, B, C, O, N, Pd, Pt, Zr, Ir, W, Mo, or Nb as long as the ferromagnetism is not lost.

(c) Tunnel Barrier Layer

The tunnel barrier layer 20 may be formed from various dielectric materials such as $AlOx$, $SiO_2$, $MgO$, $AlN$, $Bi_2O_3$, $MgF_2$, $CaF_2$, $SrTiO_2$, or $AlLaO_3$.

When the above-described materials are used, the first and second nonmagnetic layers 32 and 34 may be formed from the same material or different materials. For example, the first and second nonmagnetic layers may be formed from different materials to obtain different magnetic coupling states as the first and second magnetic coupling.

Even the first to third ferromagnetic layers 31, 33, and 35 may be formed from the same material or different materials.

[1-3] Thicknesses of Nonmagnetic Layers in Recording Layer

The thicknesses of the nonmagnetic layers in the recording layer according to the first embodiment of the present invention will be described below with reference to FIGS. 2 to 5 described above.

Thicknesses Y1 and Y2 of the first and second nonmagnetic layers 32 and 34 in the recording layer 30 are preferably defined such that the ferromagnetic layers on the upper and lower sides have strong anti-ferromagnetic coupling or weak ferromagnetic coupling. That is, the thickness of the nonmagnetic layer sandwiched between the ferromagnetic layers which are to be weakly ferromagnetically coupled is preferably larger than that of the nonmagnetic layer sandwiched between the ferromagnetic layers which are to be strongly anti-ferromagnetically coupled.

The thicknesses Y1 and Y2 of the first and second nonmagnetic layers 32 and 34 are defined in detail assuming that the first and second nonmagnetic layers 32 and 34 are formed from, e.g., Cu or Ru, and the first to third ferromagnetic layers 31, 33, and 35 are formed from, e.g., NiFe.

Cu or Ru is used as the material of the first and second nonmagnetic layers 32 and 34. When the upper and lower ferromagnetic layers are to be anti-ferromagnetically coupled (FIG. 4), Ru is used. The thickness is set to, e.g., about 0.6 to 1.1 nm or about 1.75 to 2.5 nm. Especially, the thickness is set to 0.8 nm or 2.0 nm at which the interlayer coupling energy J is large. On the other hand, when the upper and lower ferromagnetic layers are to be ferromagnetically coupled (FIG. 5), Cu is used. The thickness is set to, e.g., 2.0 nm at which the interlayer coupling energy J is smaller than that in anti-ferromagnetic coupling by about one order of magnitude.

In the magnetic coupling states (a) and (b) shown in FIGS. 2 and 3, when the first and second nonmagnetic layers 32 and 34 are formed from Cu or Ru, the thicknesses Y1 and Y2 of the first and second nonmagnetic layers 32 and 34 are defined as follows.

As shown in FIG. 2, (a) when the first magnetic coupling is anti-ferromagnetic coupling, and the second magnetic coupling is ferromagnetic coupling, the thickness Y1 of the first nonmagnetic layer 32 made of Ru is set to, e.g., 0.8 nm such that the first and second ferromagnetic layers 31 and 33 are strongly anti-ferromagnetically coupled. The thickness Y2 of the second nonmagnetic layer 34 made of Cu is set to, e.g., 2.0 nm such that the second and third ferromagnetic layers 33 and 35 are weakly ferromagnetically coupled. As described above, the thickness Y2 of the second nonmagnetic layer 34 is set larger than the thickness Y1 of the first nonmagnetic layer 32.

As shown in FIG. 3, (b) when the first magnetic coupling is ferromagnetic coupling, and the second magnetic coupling is anti-ferromagnetic coupling, the thickness Y1 of the first nonmagnetic layer 32 made of Cu is set to, e.g., 2.0 nm such that the first and second ferromagnetic layers 31 and 33 are weakly ferromagnetically coupled. The thickness Y2 of the second nonmagnetic layer 34 made of Ru is set to, e.g., 0.8 nm such that the second and third ferromagnetic layers 33 and 35 are strongly anti-ferromagnetically coupled. As described above, the thickness Y1 of the first nonmagnetic layer 32 is set larger than the thickness Y2 of the second nonmagnetic layer 34.

The thicknesses of the first and second nonmagnetic layers 32 and 34 are preferably different by, e.g., about 2 to 10 times. This is because weaker ferromagnetic coupling is necessary.

[1-4] Thicknesses of Ferromagnetic Layers in Recording Layer

Thicknesses X1, X2, and X3 of the first to third ferromagnetic layers 31, 33, and 35 in the recording layer 30 are preferably defined to reduce the leakage field from the recording layer 30. Hence, the thicknesses X1, X2, and X3 of the first to third ferromagnetic layers 31, 33, and 35 are defined as follows by the two magnetic coupling states of the first and second magnetic coupling.

As shown in FIG. 2, (a) when the first magnetic coupling is anti-ferromagnetic coupling, and the second magnetic coupling is ferromagnetic coupling, the thickness X1 of the first ferromagnetic layer 31 preferably almost equals the total thickness (X2+X3) of the second and third ferromagnetic layers 33 and 35. Accordingly, in a nonenergized state, the magnetization (magnetization energy) of the first ferromagnetic layer 31 can almost equal the composed magnetization (magnetization energy) of the second and third ferromagnetic layers 33 and 35. Hence, the leakage field generated toward the right of the drawing surface by the magnetization of the first ferromagnetic layer 31 and the leakage field generated toward the left of the drawing surface by the magnetization of the second and third ferromagnetic layers 33 and 35 can cancel each other.

As shown in FIG. 3, (b) when the first magnetic coupling is ferromagnetic coupling, and the second magnetic coupling is anti-ferromagnetic coupling, the total thickness (X1+X2) of the first and second ferromagnetic layers 31 and 33 preferably almost equals the thickness X3 of the third ferromagnetic layer 35. Accordingly, in a nonenergized state, the composed magnetization (magnetization energy) of the first and second ferromagnetic layers 31 and 33 can almost equal the magnetization (magnetization energy) of the third ferromagnetic layer 35. Hence, the leakage field generated toward the right of the drawing surface by the magnetization of the first and second ferromagnetic layers 31 and 33 and the leakage field generated toward the left of the drawing surface by the magnetization of the third ferromagnetic layer 35 can cancel each other.

The thicknesses X2 and X3 of the second and third ferromagnetic layers 33 and 35 in (a), or the thicknesses X1 and X2 of the first and second ferromagnetic layers 31 and 33 in (b) may be set to be almost equal to each other or different from each other.

[1-5] Shape of MTJ Element

As for the shape of the MTJ element 1, the fixed layer 10, tunnel barrier layer 20, and recording layer 30 have the same width, and the side surfaces of all the layers are flush, as shown in FIG. 1. This is because the layers in the MTJ element 1 are processed at once.

However, the shape of the MTJ element 1 is not limited to the shape shown in FIG. 1, and various changes and modifications can be made. Modifications of the MTJ element 1 will be described below.

(a) First Modification

Figure 6:
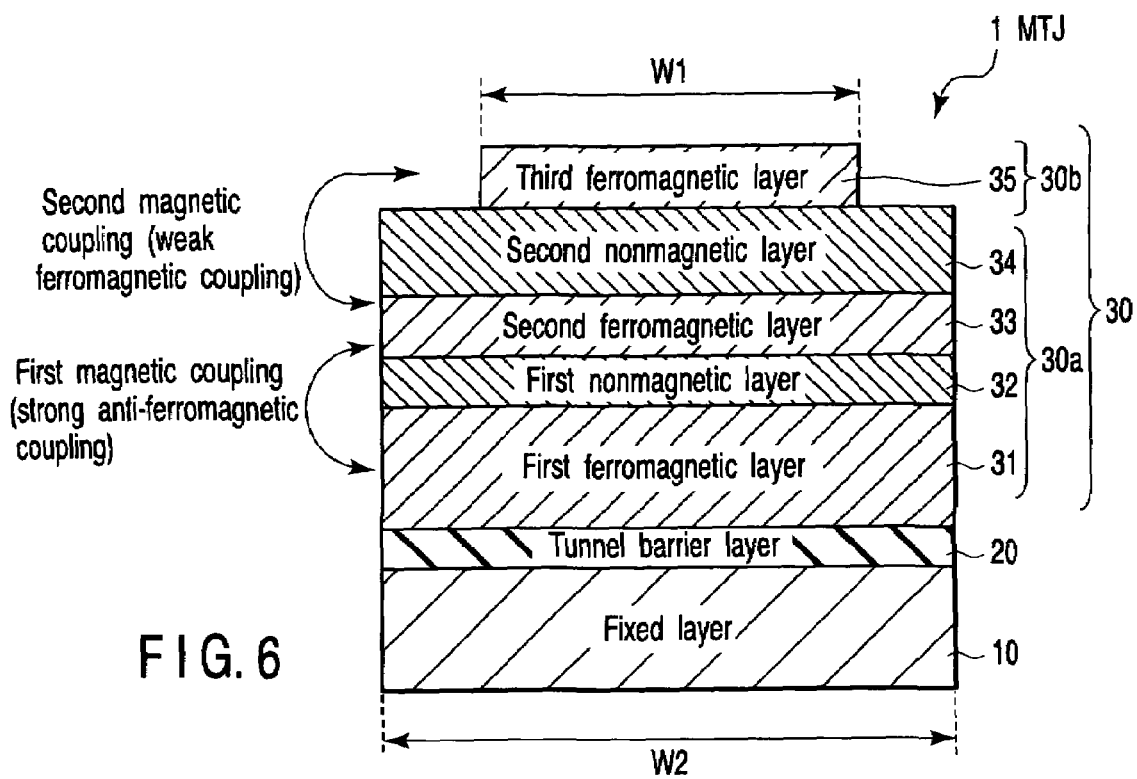
FIG. 6 is a sectional view showing the first modification of the MTJ element according to the first embodiment of the present invention.

FIG. 6 is a sectional view showing the first modification of the MTJ element according to the first embodiment of the present invention.

As shown in FIG. 6, the MTJ element 1 of the first modification can be formed when (a) the first magnetic coupling is strong anti-ferromagnetic coupling and the second magnetic coupling is weak ferromagnetic coupling, as described above. In this case, since the ferromagnetic coupling between the second and third ferromagnetic layers 33 and 35 can be weak, the second and third ferromagnetic layers 33 and 35 may be separated.

In the first modification, the recording layer 30 is divided into a first portion 30a and a second portion 30b. The first portion 30a includes the first ferromagnetic layer 31, first nonmagnetic layer 32, second ferromagnetic layer 33, and second nonmagnetic layer 34. The second portion 30b includes the third ferromagnetic layer 35. A width W1 of the second portion 30b is smaller than a width W2 of the fixed layer 10, tunnel barrier layer 20, and first portion 30a.

The shape of the first modification can be formed by processing the MTJ element 1, e.g., twice. More specifically, the layers of the MTJ element 1 are sequentially formed. Then, the third ferromagnetic layer 35 is patterned into the width W1. After that, the fixed layer 10, tunnel barrier layer 20, and first portion 30a are patterned into the width W2.

(b) Second Modification

Figure 7:
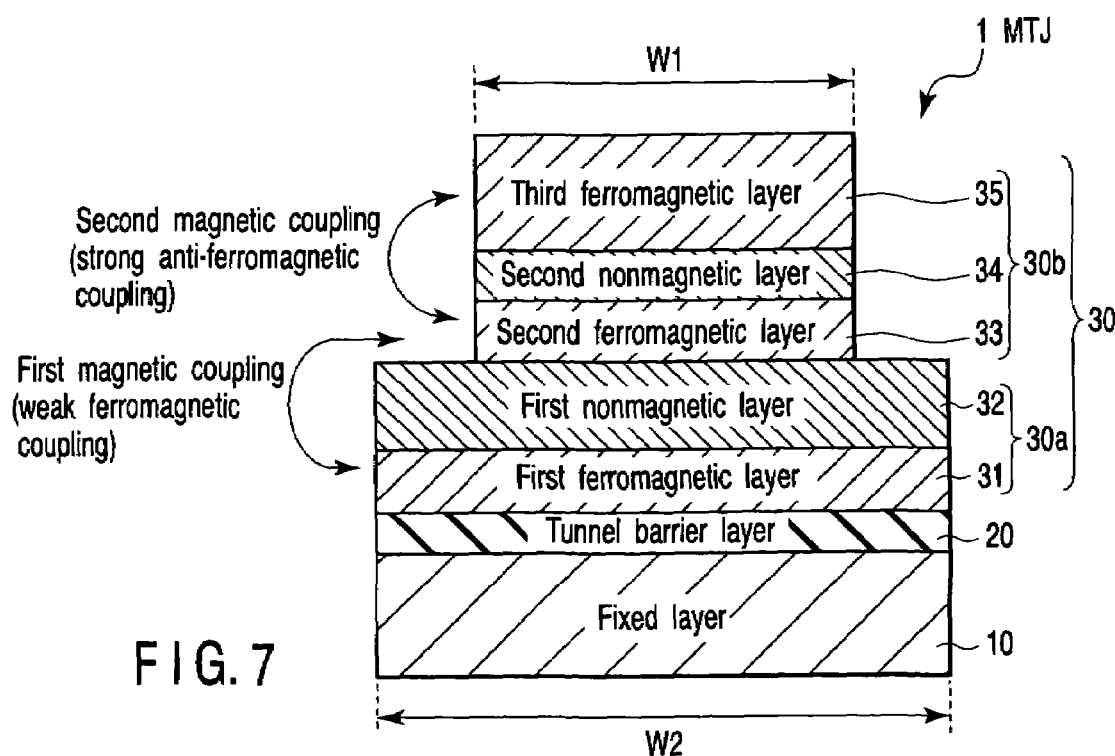
FIG. 7 is a sectional view showing the second modification of the MTJ element according to the first embodiment of the present invention.

FIG. 7 is a sectional view showing the second modification of the MTJ element according to the first embodiment of the present invention.

As shown in FIG. 7, the MTJ element 1 of the second modification can be formed when (b) the first magnetic coupling is weak ferromagnetic coupling, and the second magnetic coupling is strong anti-ferromagnetic coupling, as described above. In this case, since the ferromagnetic coupling between the first and second ferromagnetic layers 31 and 33 can be weak, the first and second ferromagnetic layers 31 and 33 may be separated.

In the second modification as well, the recording layer 30 is divided into the first portion 30a and the second portion 30b. The first portion 30a includes the first ferromagnetic layer 31 and first nonmagnetic layer 32. The second portion 30b includes the second ferromagnetic layer 33, second nonmagnetic layer 34, and the third ferromagnetic layer 35. The width W1 of the second portion 30b is smaller than the width W2 of the fixed layer 10, tunnel barrier layer 20, and first portion 30a.

The shape of the second modification can be formed by processing the MTJ element 1, e.g., twice, as in the first modification.

(c) Third Modification

Figure 8:
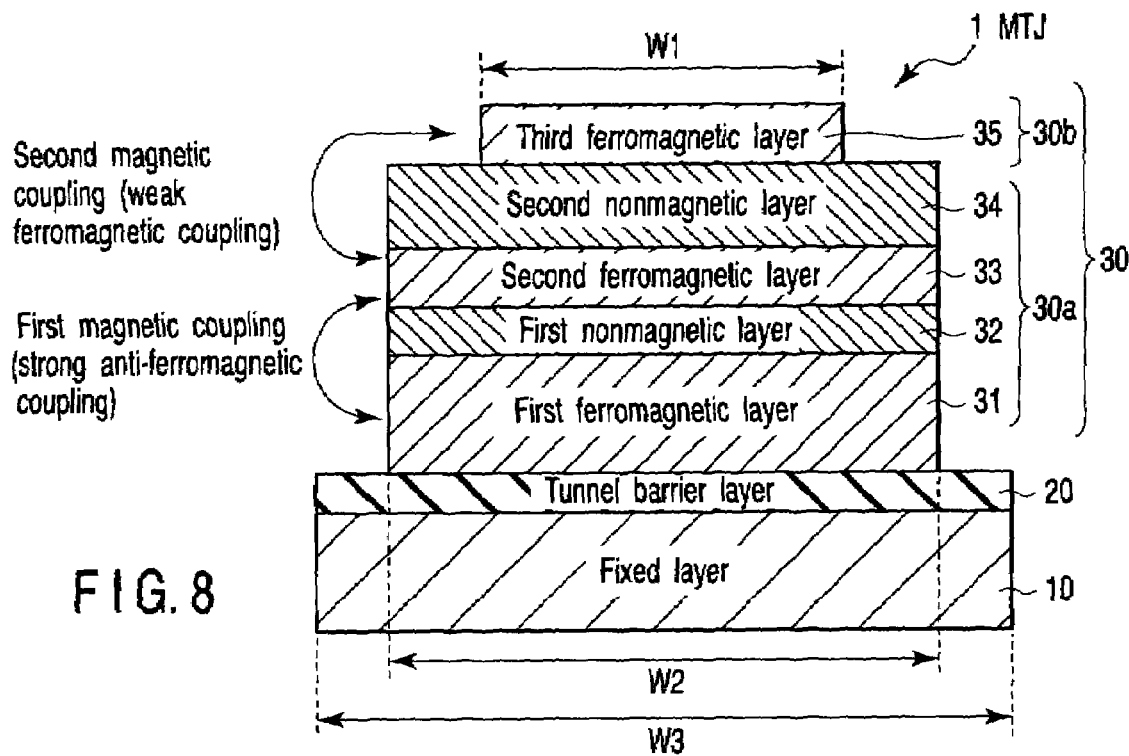
FIG. 8 is a sectional view showing the third modification of the MTJ element according to the first embodiment of the present invention.

FIG. 8 is a sectional view showing the third modification of the MTJ element according to the first embodiment of the present invention.

As shown in FIG. 8, the MTJ element 1 of the third modification can be formed for the magnetic coupling state (a), as in the first modification. The third modification is different from the first modification in that the width W2 of the first portion 30a including the first ferromagnetic layer 31, first nonmagnetic layer 32, second ferromagnetic layer 33, and second nonmagnetic layer 34 is different from a width W3 of the fixed layer 10 and tunnel barrier layer 20.

More specifically, in the third modification, the width W2 of the first portion 30a is smaller than the width W3 of the fixed layer 10 and tunnel barrier layer 20. The width W1 of the second portion 30b is smaller than the width W2 of the first portion 30a.

The shape of the third modification can be formed by processing the MTJ element 1, e.g., three times. More specifically, the layers of the MTJ element 1 are sequentially formed. The third ferromagnetic layer 35 is patterned into the width W1. Next, the first portion 30a is patterned into the width W2. After that, the fixed layer 10 and tunnel barrier layer 20 are patterned into the width W3.

(d) Fourth Modification

Figure 9:
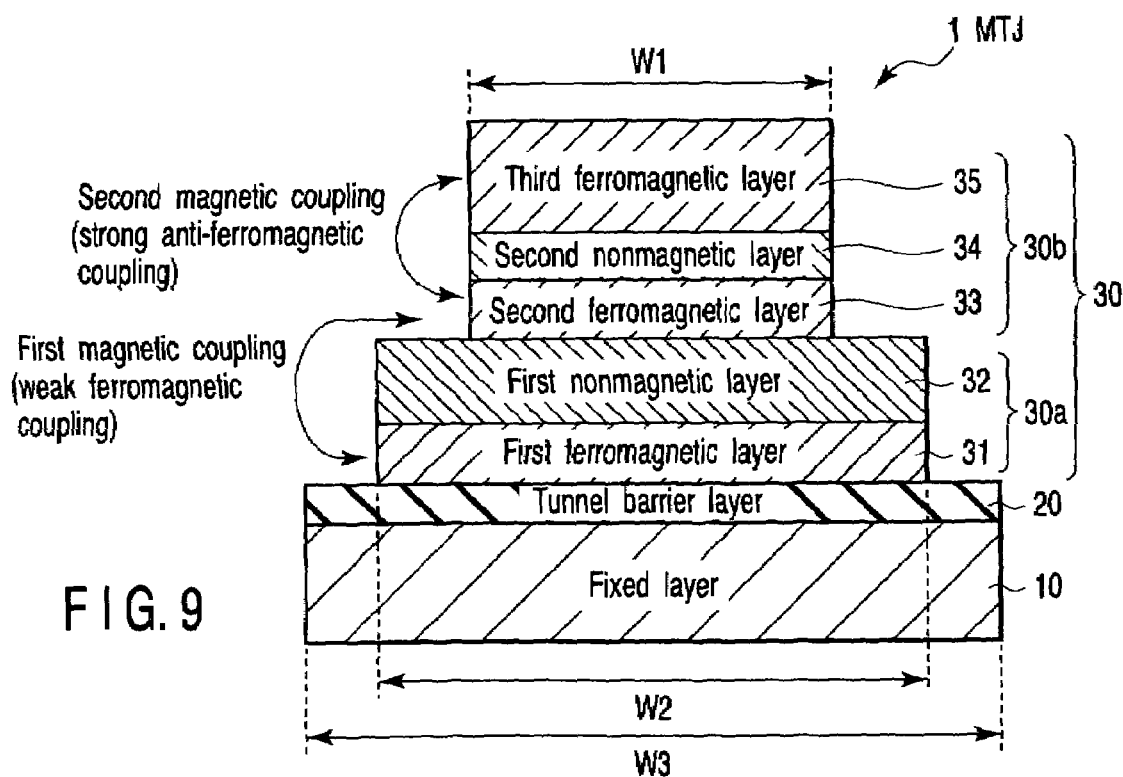
FIG. 9 is a sectional view showing the fourth modification of the MTJ element according to the first embodiment of the present invention.

FIG. 9 is a sectional view showing the fourth modification of the MTJ element according to the first embodiment of the present invention.

As shown in FIG. 9, the MTJ element 1 of the fourth modification can be formed for the magnetic coupling state (b), as in the second modification. The fourth modification is different from the second modification in that the width W2 of the first portion 30a including the first ferromagnetic layer 31 and first nonmagnetic layer 32 is different from the width W3 of the fixed layer 10 and tunnel barrier layer 20.

More specifically, in the fourth modification, the width W2 of the first portion 30a is smaller than the width W3 of the fixed layer 10 and tunnel barrier layer 20. The width W1 of the second portion 30b is smaller than the width W2 of the first portion 30a.

The shape of the fourth modification can be formed by processing the MTJ element 1, e.g., three times.

(e) Fifth Modification

Figure 10A:
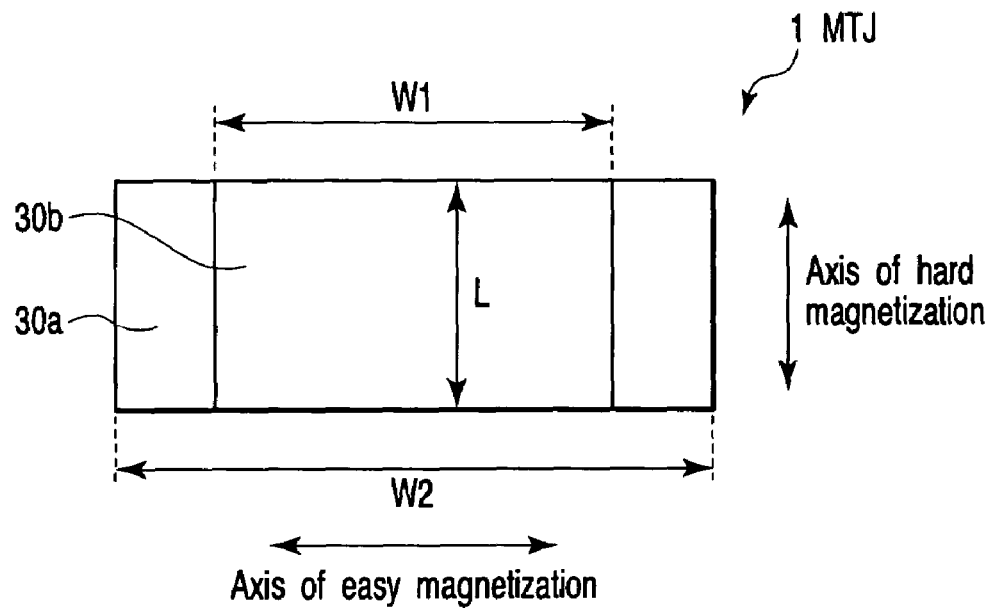
FIGS. 10A and 10B are plan views showing the fifth modification of the MTJ element according to the first embodiment of the present invention.
Figure 10B:
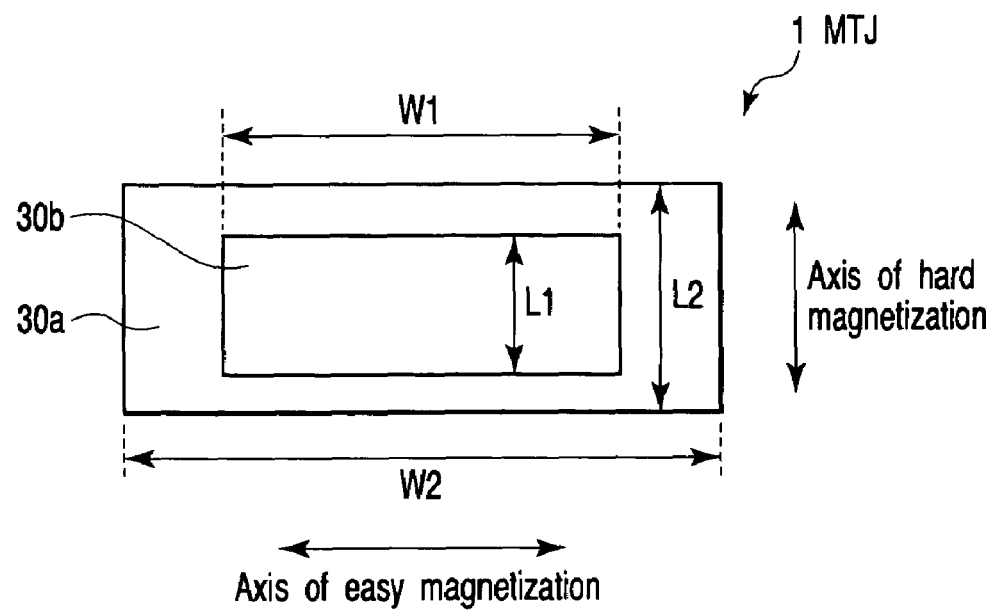

FIGS. 10A and 10B are plan views showing the fifth modification of the MTJ element according to the first embodiment of the present invention. In this example, the MTJ element has the two widths W1 and W2, as in the first or second modification.

As shown in FIGS. 10A and 10B, the above-described widths W1 and W2 of the layers indicate widths along the axis of easy magnetization. The first portion 30a and second portion 30b in the recording layer have different planar sizes. The planar size of the first portion 30a is larger than that of the second portion 30b.

As shown in FIG. 10A, the first portion 30a and second portion 30b may have the same width L along the axis of hard magnetization. As shown in FIG. 10B, a width L1 of the first portion 30a along the axis of hard magnetization may be smaller than a width L2 of the second portion 30b along the axis of hard magnetization.

[1-6] Structure of Memory Cell

FIG. 11 is a plan view showing a memory cell of the magnetic random access memory according to the first embodiment of the present invention.

As shown in FIG. 11, a bit line 41 runs in the Y direction. A word line 42 runs in the X direction (a direction perpendicular to the Y direction). The MTJ element 1 is arranged at the intersection between the bit line 41 and the word line 42 while being sandwiched between the bit line 41 and word line 42. The axis of easy magnetization of the MTJ element 1 tilts by, e.g., 45° with respect to the X or Y direction. In other words, the axis of easy magnetization of the MTJ element 1 tilts by 30° to 60°, and more preferably, about 45° with respect to the direction in which a write current I1 of the bit line 41 flows or the direction in which a write current I2 of the word line 42 flows to implement a write operation to be described later.

Figure 12:
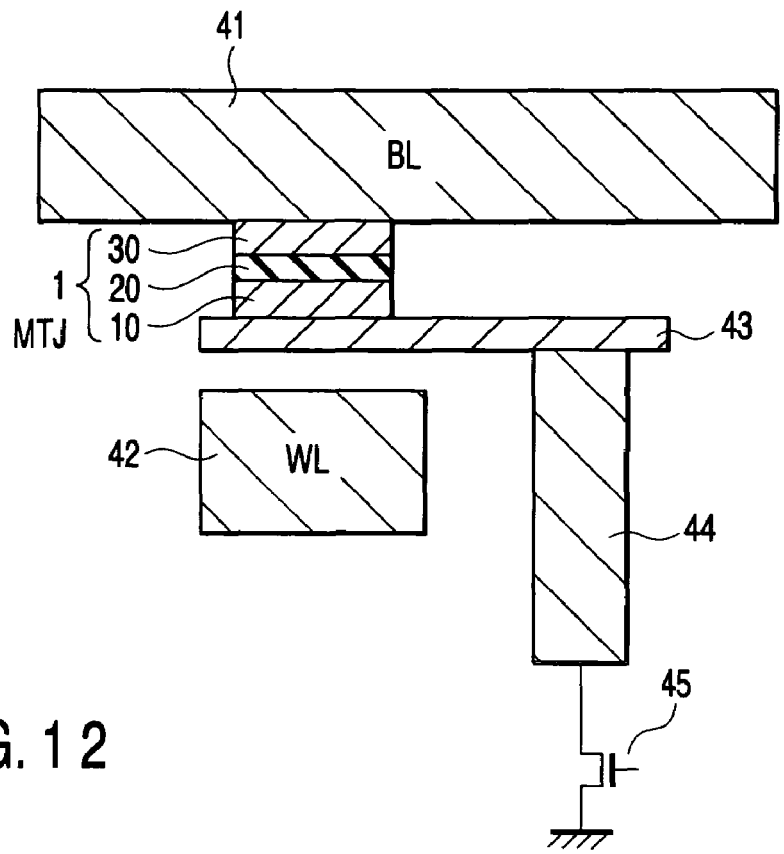
FIG. 12 is a sectional view showing a memory cell having a 1 Tr+1 MTJ structure in the magnetic random access memory according to the first embodiment of the present invention.
Figure 13:
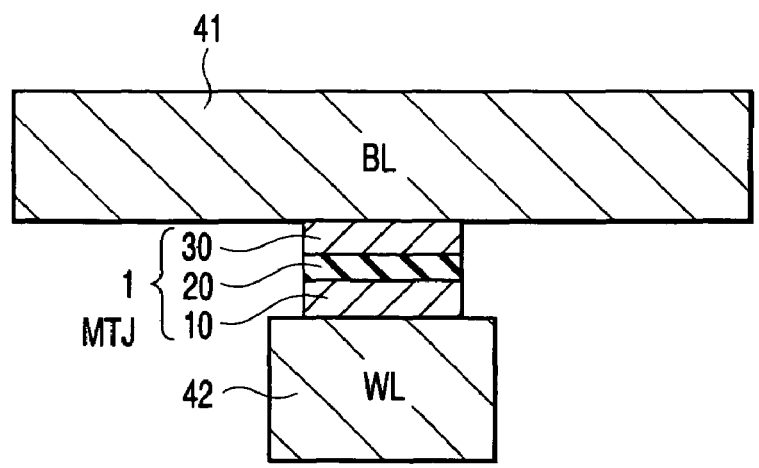
FIG. 13 is a sectional view showing a memory cell having a cross-point structure in the magnetic random access memory according to the first embodiment of the present invention.

FIG. 12 is a sectional view showing a memory cell having a 1 Tr+1 MTJ structure in the magnetic random access memory according to the first embodiment of the present invention. FIG. 13 is a sectional view showing a memory cell having a cross-point structure in the magnetic random access memory according to the first embodiment of the present invention. In the magnetic random access memory according to the first embodiment of the present invention, the structure of the memory cell can be applied to various types.

For example, as shown in FIG. 12, the MTJ element 1 is arranged at the intersection between the bit line 41 and the word line 42. One terminal of the MTJ element 1 is electrically connected to the bit line 41. The other terminal of the MTJ element 1 is electrically connected to a read switching element (e.g., a MOS transistor or a diode) 45 through a lower metal layer 43 and a contact 44. This embodiment can be applied to the memory cell having a so-called 1 Tr+1 MTJ structure including one transistor and one MTJ element in one cell.

Alternatively, as shown in FIG. 13, the MTJ element 1 is arranged at the intersection between the bit line 41 and the word line 42. One terminal of the MTJ element 1 is electrically connected to the bit line 41. The other terminal of the MTJ element 1 is electrically connected to the word line 42. This embodiment can also be applied to the memory cell having a so-called cross-point structure having no read switching element for each cell.

[1-7] Write Operation/Read Operation (a) Write Operation

Figure 14:
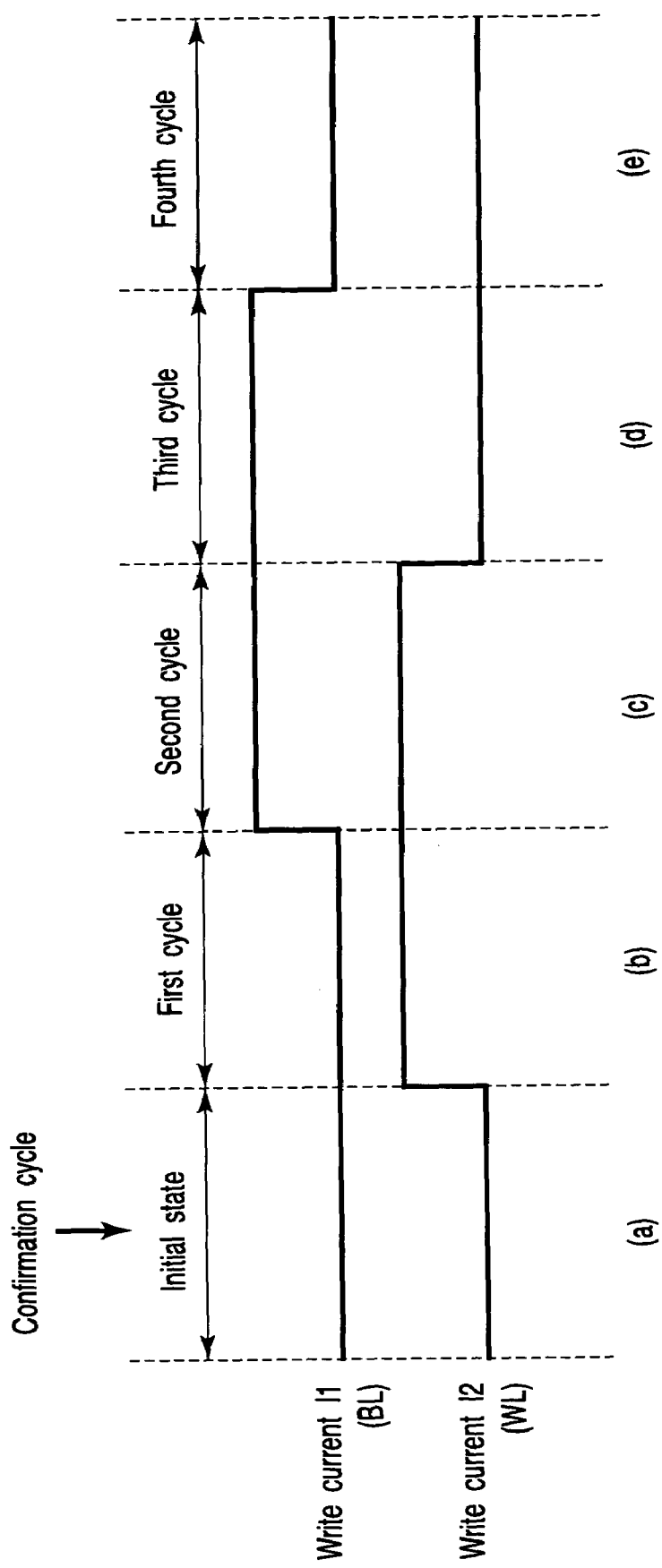
FIG. 14 is explanatory view showing a write operation in the magnetic random access memory according to the first embodiment of the present invention.
Figure 16A:
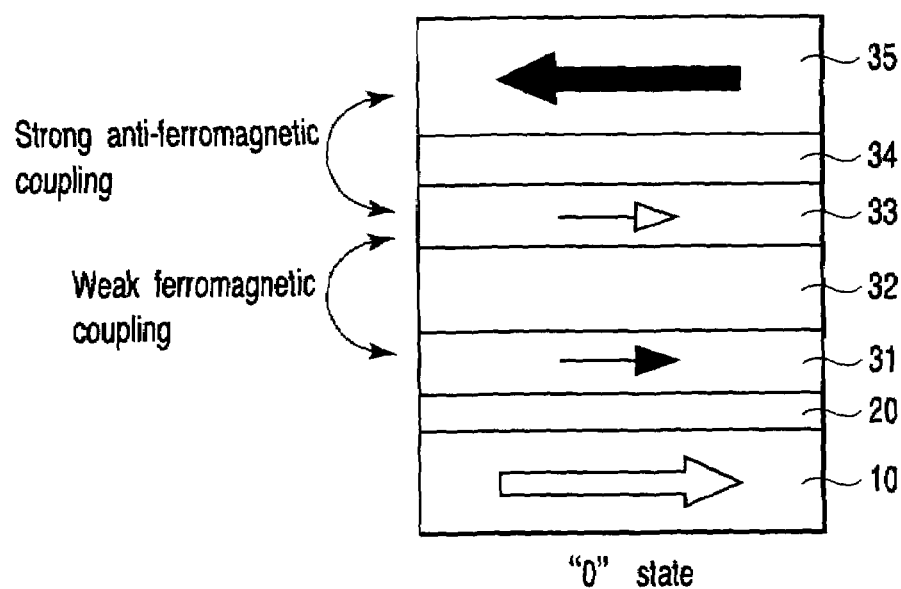
FIGS. 16A and 16B are views respectively showing the "0" and "1" states in the MTJ element according to the first embodiment of the present invention.
Figure 16B:
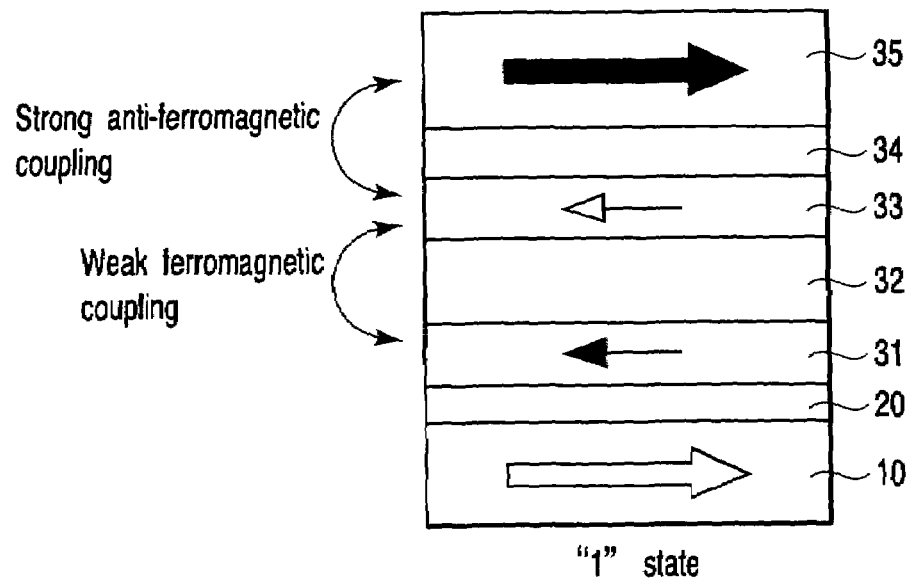

FIG. 14 is explanatory view of a write operation in the magnetic random access memory according to the first embodiment of the present invention. FIGS. 15A to 15E are schematic views showing magnetization states in the cycles of the write operation shown in FIG. 14. FIGS. 16A and 16B are views respectively showing the "0" and "1" states in the MTJ element according to the first embodiment of the present invention.

In the first embodiment, a so-called toggle write is executed so that data of a selected cell is read out before data is written in the selected cell. In writing arbitrary data in the selected cell, the data of the selected cell is read out. If the arbitrary data is already written, no write is executed. If data different from the arbitrary data is written, a write is executed to rewrite the data. For example, in writing "0" data in the selected cell, the data of the selected cell is read out. If the readout data is "0" data, no write is executed. A write is executed only when the readout data is "1" data. Similarly, in writing "1" data in the selected cell, the data of the selected cell is read out. If the readout data is "1" data, no write is executed. A write is executed only when the readout data is "0" data. In other words, an MTJ element in an anti-parallel state changes o a parallel state, and an MTJ element in a parallel state changes to an anti-parallel state by the write.

After the above-described confirmation cycle, if data must be written in the selected cell, two write wiring lines are sequentially turned on. The write wiring line which has been turned on first is turned off first. Then, the write wiring line which has been turned on later is turned off. For example, the procedures include four cycles: the word line 42 is turned on to supply the write current I2→the bit line 41 is turned on to supply the write current I1→the word line 42 is turned off to stop supplying the write current I2→the bit line 41 is turned off to stop supplying the write current I1 (FIG. 14).

The write operation will be described below in detail. An example will be described below, in which the write operation is necessary, i.e., the rewrite of data of the selected cell is executed as a result of confirmation cycle.

(Initial State)

In the initial state, as shown in (a) of FIG. 14, both the bit line 41 and the word line 42 are OFF. None of the write currents I1 and I2 flow to them, i.e., a nonenergized state is set.

Assume that the state shown in FIG. 16A is set as the initial state. More specifically, as shown in FIG. 16A, the first and second ferromagnetic layers 31 and 33 are weakly ferromagnetically coupled, and the second and third ferromagnetic layers 33 and 35 are strongly anti-ferromagnetically coupled. The magnetization direction of the first and second ferromagnetic layers 31 and 33 is right. The magnetization direction of the third ferromagnetic layer 35 is left. The magnetization direction of the fixed layer 10 is right. This is a state in which "0" data is written.

In this initial state, as shown in FIG. 15A, the magnetization direction of the first and second ferromagnetic layers 31 and 33 is different from that of the third ferromagnetic layer 35 by 180°. The composed magnetization (magnetization energy) of the first and second ferromagnetic layers 31 and 33 almost equals the magnetization (magnetization energy) of the third ferromagnetic layer 35. For this reason, their magnetization (magnetization energies) balance. Hence, the composed field in the recording layer 30 is almost 0 in the initial state.

Assume that the magnetization direction of the first and second ferromagnetic layers 31 and 33 is 0°, and the magnetization direction of the third ferromagnetic layer 35 is 180°.

(First Cycle)

In the first cycle, as shown in (b) of FIG. 14, the bit line 41 is kept in the OFF state not to supply the write current I1. The word line 42 is turned on to supply the write current I2.

In the first cycle, as shown in FIG. 15B, the magnetization of the first to third ferromagnetic layers 31, 33, and 35 rotates clockwise while maintaining the weak ferromagnetic coupling state and strong anti-ferromagnetic coupling state. As a result, the composed magnetization in the recording layer 30 is directed to the direction of current field (the direction in which the bit line 41 runs) generated in the word line 42, i.e., almost a 45° direction.

(Second Cycle)

In the second cycle, as shown in (c) of FIG. 14, the bit line 41 is also turned on to supply the write current I1 while keeping supplying the write current I2 to the word line 42.

In the second cycle, as shown in FIG. 15C, the magnetization of the first to third ferromagnetic layers 31, 33, and 35 further rotates clockwise while maintaining the weak ferromagnetic coupling state and strong anti-ferromagnetic coupling state. As a result, the composed magnetization in the recording layer 30 is directed to the direction of composed field of the current field generated in the word line 42 and that generated in the bit line 41, i.e., almost a 0° direction.

(Third Cycle)

In the third cycle, as shown in (d) of FIG. 14, the word line 42 is turned off to stop supplying the write current I2 while keeping supplying the write current I1 to the bit line 41.

In the third cycle, as shown in FIG. 15D, the magnetization of the first to third ferromagnetic layers 31, 33, and 35 further rotates clockwise while maintaining the weak ferromagnetic coupling state and strong anti-ferromagnetic coupling state. As a result, the composed magnetization in the recording layer 30 is directed to the direction of current field (the direction in which the word line 42 runs) generated in the bit line 41, i.e., almost a −45° direction.

(Fourth Cycle)

In the fourth cycle, as shown in (e) of FIG. 14, the bit line 41 is turned off, like the word line 42, to stop supplying the write current I1.

In the fourth cycle, as shown in FIG. 15E, the magnetization of the first to third ferromagnetic layers 31, 33, and 35 is going to return to a stable state in the 0° and 180° directions. As a result, the composed magnetization in the recording layer 30 becomes almost 0.

In this way, the magnetization of the first and second ferromagnetic layers 31 and 33 is rotated clockwise in the direction from 0° to 180°, and the magnetization of the third ferromagnetic layer 35 is rotated clockwise in the direction from 180° to 0°. Accordingly, the magnetization of the first to third ferromagnetic layers 31, 33, and 35 can be rotated by 180° from the initial state. As a result, as shown in FIG. 16B, "1" data is written in the MTJ element 1.

In the write operation, the write currents I1 and I2 can be supplied in the same directions in both the write of "0" data and the write of "1" data.

(b) Read Operation

Data written in the MTJ element 1 is read out by the following method.

For example, when a memory cell having a 1 Tr+1 MTJ structure shown in FIG. 12 is used, the read switching element 45 is turned on, and a read current is supplied to the MTJ element 1 from the bit line 41, thereby reading the magnetic resistance of the MTJ element 1. That is, the difference in magnetic resistance between the "1"-data written state and the "0"-data written state is read, thereby discriminating the data written in the MTJ element 1.

According to the first embodiment, the recording layer 30 of the MTJ element 1 has a multilayered structure in which weak ferromagnetic coupling and strong anti-ferromagnetic coupling occur. The MTJ element 1 is arranged while being tilted by 45° with respect to the direction in which the bit line 41 or word line 42 runs. In a data write, the write wiring lines including the bit line 41 and word line 42 are sequentially turned on. The write wiring line which has been turned on first is turned off first. Then, the write wiring line which has been turned on later is turned off. The magnetization of the recording layer 30 is rotated in such a plurality of cycles to write data in the MTJ element 1. The data cannot easily be rewritten only by applying the magnetization of one write wiring line to the cell. Hence, any write error in a semi-selected cell can be suppressed.

The recording layer 30 of the MTJ element 1 includes ferromagnetic layers which are weakly ferromagnetically coupled and ferromagnetic layers which are strongly anti-ferromagnetically coupled. That is, two magnetic coupling states are generated in the recording layer 30. As the weak magnetic coupling state, ferromagnetic coupling is used. The strength of ferromagnetic coupling can arbitrarily be adjusted because it does not largely oscillate in accordance with a variation in thickness of a nonmagnetic layer. Since ferromagnetic coupling is weakened to an optimum value, the magnetization can be rotated by the relatively small write currents I1 and I2. Hence, the write current can be reduced.

Even in a toggle MRAM which uses two anti-ferromagnetically coupled recording layers, the write current can be reduced theoretically by weakening the anti-ferromagnetic coupling. However, Ru is normally used as the material of a nonmagnetic layer to be used to anti-ferromagnetically couple upper and lower ferromagnetic layers. When Ru is used, the interlayer coupling energy largely varies in accordance with the variation in Ru thickness, as shown in FIG. 4. Especially, when the anti-ferromagnetic coupling is weakened, the state becomes very unstable. Hence, in a toggle operation using "weak" anti-ferromagnetic coupling, it is difficult to reduce the write current with good controllability.

In the first embodiment, however, a toggle operation using "strong" anti-ferromagnetic coupling is executed. That is, even when Ru which is normally used to anti-ferromagnetically couple upper and lower ferromagnetic layers is used, a state that is more resistant and stable for the variation in thickness can be obtained in strong anti-ferromagnetic coupling than in weak anti-ferromagnetic coupling, as shown in FIG. 4. Additionally, in the first embodiment, "weak" ferromagnetic coupling is also used. In the weak ferromagnetic coupling (J: about 0.02 or less), the change amount of the interlayer coupling energy J for the thickness can be minimized by using a substance such as Cu which monotonically decreases the interlayer coupling energy J within the positive range for the thickness (at least without any oscillation between positive and negative values). As described above, in the first embodiment, the write current value can be reduced with good controllability. Hence, an inexpensive general-purpose MRAM can be implemented at a high yield.

[2] SECOND EMBODIMENT

In the second embodiment, the number of layers included in the recording layer of an MTJ element is larger than that in the first embodiment. The recording layer includes four ferromagnetic layers.

[2-1] Outline of MTJ Element

Figure 17:
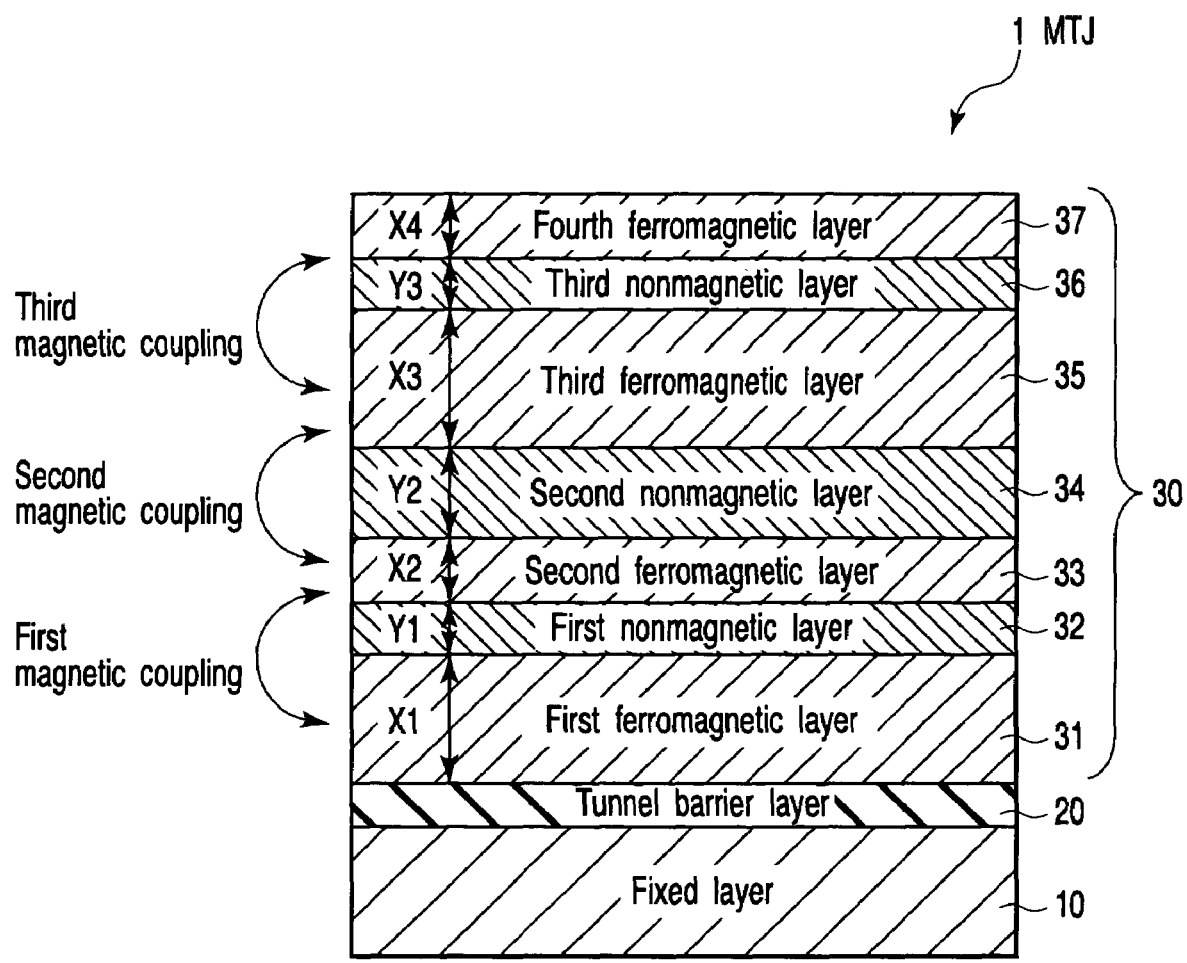
FIG. 17 is a sectional view showing an MTJ element in a magnetic random access memory according to the second embodiment of the present invention.
Figure 18:
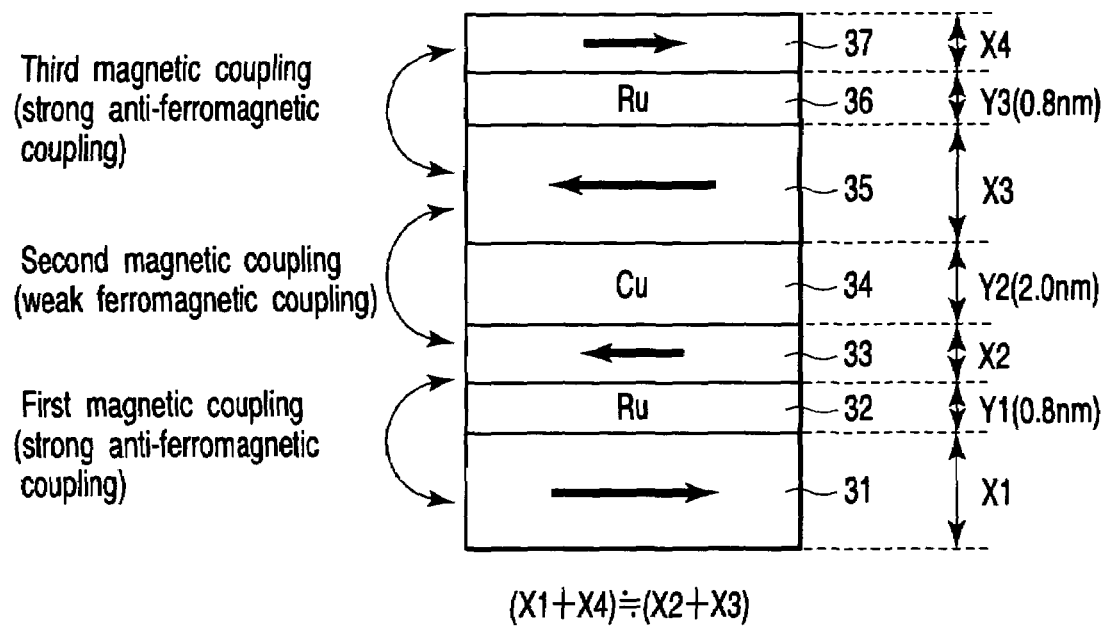
FIG. 18 is a schematic view showing the recording layer of the MTJ element in the magnetic random access memory according to the second embodiment of the present invention when the first and third magnetic coupling are anti-ferromagnetic coupling, and the second magnetic coupling is ferromagnetic coupling.
Figure 19:
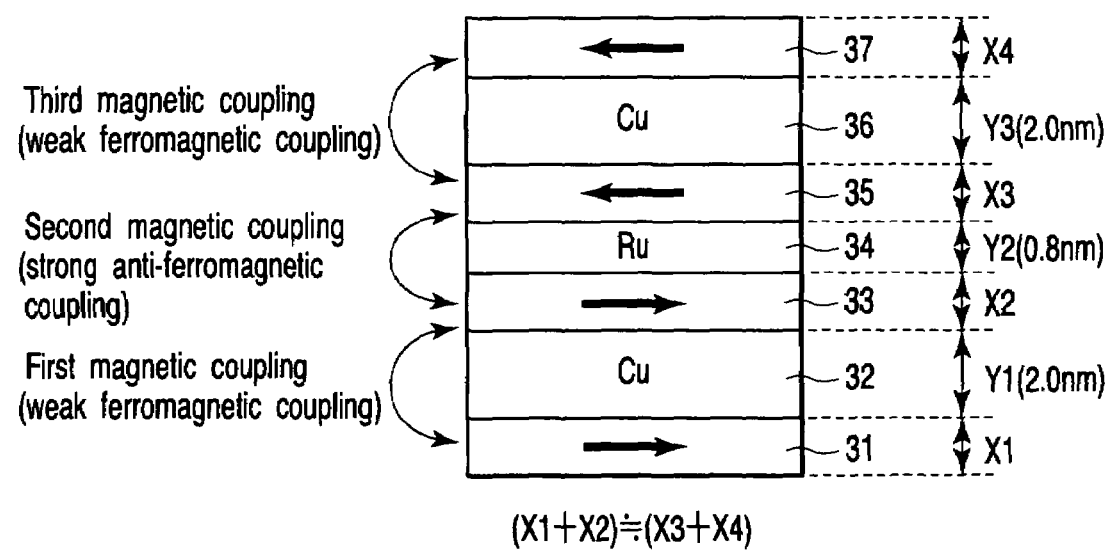
FIG. 19 is a schematic view showing the recording layer of the MTJ element in the magnetic random access memory according to the second embodiment of the present invention when the first and third magnetic coupling are ferromagnetic coupling, and the second magnetic coupling is anti-ferromagnetic coupling.

FIG. 17 is a sectional view showing an MTJ element in a magnetic random access memory according to the second embodiment of the present invention. FIGS. 18 and 19 are schematic views showing the magnetic coupling states of the recording layer included in the MTJ element according to the second embodiment of the present invention. The outline of the MTJ element of the magnetic random access memory according to the second embodiment of the present invention will be described below.

As shown in FIG. 17, the second embodiment is different from the first embodiment in that a recording layer 30 includes four ferromagnetic layers.

More specifically, four, first to fourth ferromagnetic layers 31, 33, 35, and 37 are formed. A first nonmagnetic layer 32 is inserted between the first ferromagnetic layer 31 and the second ferromagnetic layer 33. A second nonmagnetic layer 34 is inserted between the second ferromagnetic layer 33 and the third ferromagnetic layer 35. A third nonmagnetic layer 36 is inserted between the third ferromagnetic layer 35 and the fourth ferromagnetic layer 37.

The first ferromagnetic layer 31 and second ferromagnetic layer 33 are magnetically coupled via the first nonmagnetic layer 32 in a first magnetic coupling state. The second ferromagnetic layer 33 and third ferromagnetic layer 35 are magnetically coupled via the second nonmagnetic layer 34 in a second magnetic coupling state. The third ferromagnetic layer 35 and fourth ferromagnetic layer 37 are magnetically coupled via the third nonmagnetic layer 36 (to be referred to as third magnetic coupling hereinafter).

For the first to third magnetic coupling, two states are possible: (c) the first magnetic coupling is anti-ferromagnetic coupling, the second magnetic coupling is ferromagnetic coupling, and the third magnetic coupling is anti-ferromagnetic coupling (FIG. 18), and (d) the first magnetic coupling is ferromagnetic coupling, the second magnetic coupling is anti-ferromagnetic coupling, and the third magnetic coupling is ferromagnetic coupling (FIG. 19). Hence, the first and third magnetic coupling are the same magnetic coupling state.

In either of (c) and (d), the coupled field strength (interlayer coupling energy) in ferromagnetic coupling is low, and that in anti-ferromagnetic coupling is high.

[2-2] Materials of MTJ Element

The fourth ferromagnetic layer 37 is formed from the same material as that of the first to third ferromagnetic layers 31, 33, and 35, and the third nonmagnetic layer 36 is formed from the same material as that of the first and second nonmagnetic layers 32 and 34, and a description thereof will be omitted.

[2-3] Thicknesses of Nonmagnetic Layers in Recording Layer

The thicknesses of the nonmagnetic layers in the recording layer according to the second embodiment of the present invention will be described below with reference to FIGS. 18 to 19 described above.

Thicknesses Y1, Y2, and Y3 of the first to third nonmagnetic layers 32, 34, and 36 in the recording layer 30 are preferably defined such that the ferromagnetic layers on the upper and lower sides have strong anti-ferromagnetic coupling or weak ferromagnetic coupling. That is, the thickness of the nonmagnetic layer sandwiched between the ferromagnetic layers which are to be weakly ferromagnetically coupled is preferably larger than that of the nonmagnetic layer sandwiched between the ferromagnetic layers which are to be strongly anti-ferromagnetically coupled.

In the magnetic coupling states (c) and (d) shown in FIGS. 18 and 19, when the first to third nonmagnetic layers 32, 34, and 36 are formed from Cu or Ru, the thicknesses Y1, Y2, and Y3 of the first to third nonmagnetic layers 32, 34, and 36 are defined as follows.

As shown in FIG. 18, (c) when the first magnetic coupling is anti-ferromagnetic coupling, the second magnetic coupling is ferromagnetic coupling, and the third magnetic coupling is anti-ferromagnetic coupling, each of the thicknesses Y1 and Y3 of the first and third nonmagnetic layers 32 and 36 made of Ru is set to, e.g., 0.8 nm such that the first and second ferromagnetic layers 31 and 33 and the third and fourth ferromagnetic layers 35 and 37 are strongly anti-ferromagnetically coupled. The thickness Y2 of the second nonmagnetic layer 34 made of Cu is set to, e.g., 2.0 nm such that the second and third ferromagnetic layers 33 and 35 are weakly ferromagnetically coupled. As described above, the thickness Y2 of the second nonmagnetic layer 34 is set larger than the thicknesses Y1 and Y3 of the first and third nonmagnetic layers 32 and 36.

As shown in FIG. 19, (d) when the first magnetic coupling is ferromagnetic coupling, the second magnetic coupling is anti-ferromagnetic coupling, and the third magnetic coupling is ferromagnetic coupling, the thicknesses Y1 and Y3 of the first and third nonmagnetic layers 32 and 36 made of Cu is set to, e.g., 2.0 nm such that the first and second ferromagnetic layers 31 and 33 and the third and fourth ferromagnetic layers 35 and 37 are weakly ferromagnetically coupled. The thickness Y2 of the second nonmagnetic layer 34 made of Ru is set to, e.g., 0.8 nm such that the second and third ferromagnetic layers 33 and 35 are strongly anti-ferromagnetically coupled. As described above, the thicknesses Y1 and Y3 of the first and third nonmagnetic layers 32 and 36 are set larger than the thickness Y2 of the second nonmagnetic layer 34.

[2-4] Thicknesses of Ferromagnetic Layers in Recording Layer

Thicknesses X1, X2, X3, and X4 of the first to fourth ferromagnetic layers 31, 33, 35, and 37 in the recording layer 30 are preferably defined to reduce the leakage field from the recording layer 30, as in the first embodiment. Hence, the thicknesses X1, X2, X3, and X4 of the first to fourth ferromagnetic layers 31, 33, 35, and 37 are defined as follows.

As shown in FIG. 18, (c) when the first magnetic coupling is anti-ferromagnetic coupling, the second magnetic coupling is ferromagnetic coupling, and the third magnetic coupling is anti-ferromagnetic coupling, the total thickness (X1+X4) of the first and fourth ferromagnetic layers 31 and 37 preferably almost equals the total thickness (X2+X3) of the second and third ferromagnetic layers 33 and 35. Accordingly, in a nonenergized state, the magnetization (magnetization energy) of the first and fourth ferromagnetic layers 31 and 37 can almost equal the composed magnetization (magnetization energy) of the second and third ferromagnetic layers 33 and 35. Hence, the leakage field generated toward the right of the drawing surface by the magnetization of the first and fourth ferromagnetic layers 31 and 37 and the leakage field generated toward the left of the drawing surface by the magnetization of the second and third ferromagnetic layers 33 and 35 can cancel each other.

As shown in FIG. 19, (d) when the first magnetic coupling is ferromagnetic coupling, the second magnetic coupling is anti-ferromagnetic coupling, and the third magnetic coupling is ferromagnetic coupling, the total thickness (X1+X2) of the first and second ferromagnetic layers 31 and 33 preferably almost equals the total thickness (X3+X4) of the third and fourth ferromagnetic layers 35 and 37. Accordingly, in a nonenergized state, the composed magnetization (magnetization energy) of the first and second ferromagnetic layers 31 and 33 can almost equal the magnetization (magnetization energy) of the third and fourth ferromagnetic layers 35 and 37. Hence, the leakage field generated toward the right of the drawing surface by the magnetization of the first and second ferromagnetic layers 31 and 33 and the leakage field generated toward the left of the drawing surface by the magnetization of the third and fourth ferromagnetic layers 35 and 37 can cancel each other.

In (c), the thicknesses X1 and X4 of the first and fourth ferromagnetic layers 31 and 37 and the thicknesses X2 and X3 of the second and third ferromagnetic layers 33 and 35 may be set to be almost equal to each other or different from each other. Similarly, in (d), the thicknesses X1 and X2 of the first and second ferromagnetic layers 31 and 33 and the thicknesses X3 and X4 of the third and fourth ferromagnetic layers 35 and 37 may be set to be almost equal to each other or different from each other.

[2-5] Shape of MTJ Element

As for the shape of the MTJ element 1, a fixed layer 10, tunnel barrier layer 20, and recording layer 30 have the same width, and the side surfaces of all the layers are flush, as shown in FIG. 17. This is because the layers in the MTJ element 1 are processed at once.

However, the shape of the MTJ element 1 is not limited to the shape shown in FIG. 17, and various changes and modifications can be made. Modifications of the MTJ element 1 will be described below.

(a) First Modification

Figure 20:
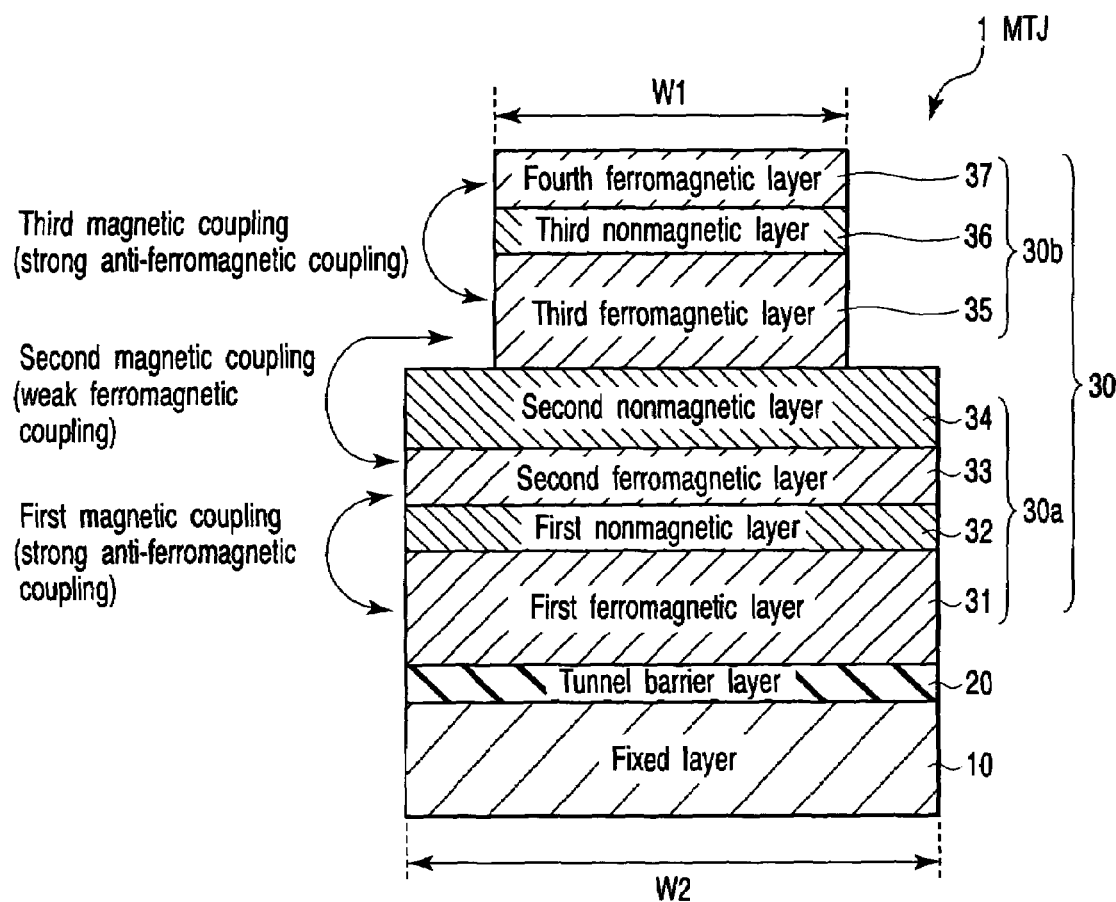
FIG. 20 is a sectional view showing the first modification of the MTJ element according to the second embodiment of the present invention.

FIG. 20 is a sectional view showing the first modification of the MTJ element according to the second embodiment of the present invention.

As shown in FIG. 20, in the first modification, the recording layer 30 is divided into a first portion 30a and a second portion 30b. The first portion 30a includes the first ferromagnetic layer 31, first nonmagnetic layer 32, second ferromagnetic layer 33, and second nonmagnetic layer 34. The second portion 30b includes the third ferromagnetic layer 35, third nonmagnetic layer 36, and fourth ferromagnetic layer 37. A width W1 of the second portion 30b is smaller than a width W2 of the fixed layer 10, tunnel barrier layer 20, and first portion 30a.

The width of the fixed layer 10 and tunnel barrier layer 20 may be larger than that of the first portion 30a, as in the third modification to the first embodiment.

(b) Second Modification

Figure 21:
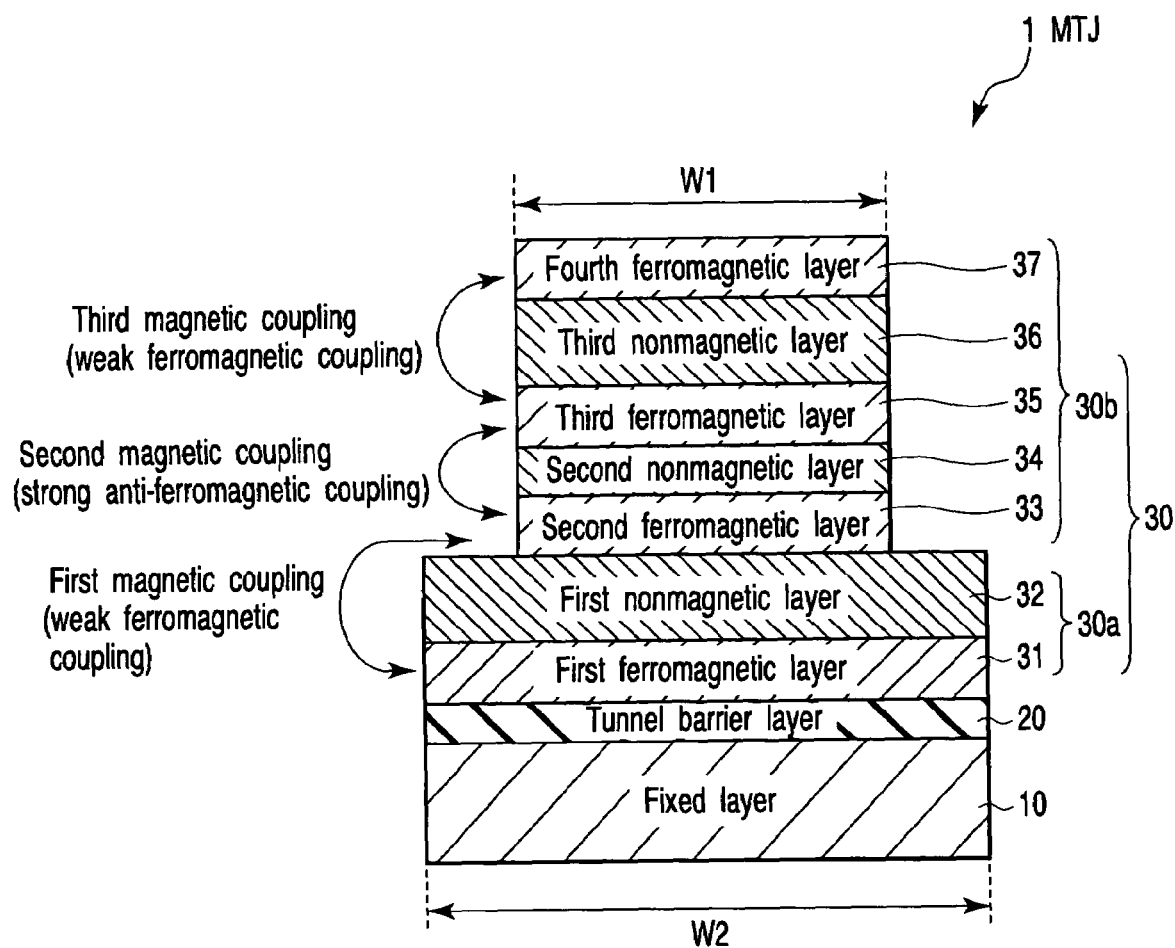
FIG. 21 is a sectional view showing the second modification of the MTJ element according to the second embodiment of the present invention.

FIG. 21 is a sectional view showing the second modification of the MTJ element according to the second embodiment of the present invention.

As shown in FIG. 21, the first portion 30a includes the first ferromagnetic layer 31 and first nonmagnetic layer 32. The second portion 30b includes the second ferromagnetic layer 33, second nonmagnetic layer 34, third ferromagnetic layer 35, third nonmagnetic layer 36, and fourth ferromagnetic layer 37. The width W1 of the second portion 30b is smaller than the width W2 of the fixed layer 10, tunnel barrier layer 20, and first portion 30a.

The width of the fixed layer 10 and tunnel barrier layer 20 may be larger than that of the first portion 30a, as in the fourth modification to the first embodiment. Alternatively, only the width of the fourth ferromagnetic layer 37 may be smaller than that of the second portion 30b.

According to the second embodiment, the same effect as in the first embodiment can be obtained. In addition, the following effect can also be obtained.

The number of ferromagnetic layers is larger in the second embodiment than in the first embodiment. Accordingly, in the recording layer 30, three layers on the second nonmagnetic layer 34 and three layers under it have the same structure. Since the symmetry of the ferromagnetic layers in the recording layer 30 increases, the toggle write operation can more reliably be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory including a magnetoresistive element which has a recording layer, a fixed layer, and an intermediate nonmagnetic layer arranged between the recording layer and the fixed layer, the recording layer comprising a first ferromagnetic layer which is formed on the intermediate nonmagnetic layer, a first nonmagnetic layer which is formed on the first ferromagnetic layer, a second ferromagnetic layer which is formed on the first nonmagnetic layer and magnetically coupled with the first ferromagnetic layer via the first nonmagnetic layer by first magnetic coupling, a second nonmagnetic layer which is formed on the second ferromagnetic layer, and a third ferromagnetic layer which is formed on the second nonmagnetic layer and magnetically coupled with the second ferromagnetic layer via the second nonmagnetic layer by second magnetic coupling, wherein one of a state in which the first magnetic coupling is anti-ferromagnetic coupling and the second magnetic coupling is ferromagnetic coupling, and a state in which the first magnetic coupling is ferromagnetic coupling and the second magnetic coupling is anti-ferromagnetic coupling is obtained.

2. The memory according to claim 1, wherein an absolute value of a magnitude of magnetic interaction in the ferromagnetic coupling is smaller than an absolute value of a magnitude of magnetic interaction in the anti-ferromagnetic coupling.

3. The memory according to claim 1, wherein the first nonmagnetic layer and the second nonmagnetic layer are formed from different materials.

4. The memory according to claim 1, wherein the second nonmagnetic layer when the first magnetic coupling is anti-ferromagnetic coupling and the second magnetic coupling is ferromagnetic coupling, and the first nonmagnetic layer when the first magnetic coupling is ferromagnetic coupling and the second magnetic coupling is anti-ferromagnetic coupling are essentially formed of one of Cu, Ag, Au, Pt, Pd, Ta, Os, and Re or an alloy containing at least one of the materials.

5. The memory according to claim 1, wherein
the first nonmagnetic layer when the first magnetic coupling is anti-ferromagnetic coupling and the second magnetic coupling is ferromagnetic coupling, and
the second nonmagnetic layer when the first magnetic coupling is ferromagnetic coupling and the second magnetic coupling is anti-ferromagnetic coupling are essentially formed of one of Ru, Ir, and Rh or an alloy containing at least one of the materials.

6. The memory according to claim 1, wherein a thickness of the first nonmagnetic layer is different from a thickness of the second nonmagnetic layer.

7. The memory according to claim 1, wherein
when the first magnetic coupling is anti-ferromagnetic coupling and the second magnetic coupling is ferromagnetic coupling, a thickness of the second nonmagnetic layer is larger than a thickness of the first nonmagnetic layer, and
when the first magnetic coupling is ferromagnetic coupling and the second magnetic coupling is anti-ferromagnetic coupling, the thickness of the first nonmagnetic layer is larger than the thickness of the second nonmagnetic layer.

8. The memory according to claim 1, wherein when the first magnetic coupling is anti-ferromagnetic coupling and the second magnetic coupling is ferromagnetic coupling, a thickness of the first ferromagnetic layer substantially equals a total thickness of the second and third ferromagnetic layers.

9. The memory according to claim 1, wherein when the first magnetic coupling is ferromagnetic coupling and the second magnetic coupling is anti-ferromagnetic coupling, a total thickness of the first and second ferromagnetic layers substantially equals a thickness of the third ferromagnetic layer.

10. The memory according to claim 1, wherein when the first magnetic coupling is anti-ferromagnetic coupling and the second magnetic coupling is ferromagnetic coupling, the recording layer has a first portion having a first width and a second portion having a second width smaller than the first width, the first portion including the first ferromagnetic layer and the second ferromagnetic layer, and the second portion including the third ferromagnetic layer.

11. The memory according to claim 10, wherein the fixed layer has a third width larger than the first width.

12. The memory according to claim 1, wherein when the first magnetic coupling is ferromagnetic coupling and the second magnetic coupling is anti-ferromagnetic coupling, the recording layer has a first portion having a first width and a second portion having a second width smaller than the first width, the first portion including the first ferromagnetic layer, and the second portion including the second ferromagnetic layer and the third ferromagnetic layer.

13. The memory according to claim 12, wherein the fixed layer has a third width larger than the first width.

14. The memory according to claim 1, which further comprises a first write wiring line and a second write wiring line, which are arranged to sandwich the magnetoresistive element, and
in which an axis of easy magnetization of the magnetoresistive element tilts by 30° to 60° with respect to a direction in which one of the first write wiring line and the second write wiring line runs.

15. The memory according to claim 1, wherein the recording layer further comprises
a third nonmagnetic layer which is formed on the third ferromagnetic layer, and
a fourth ferromagnetic layer which is formed on the third nonmagnetic layer and magnetically coupled with the third ferromagnetic layer via the third nonmagnetic layer by third magnetic coupling, and
the third magnetic coupling is the same magnetic coupling state as the first magnetic coupling.

16. The memory according to claim 1, wherein the intermediate nonmagnetic layer is a tunnel insulating layer.

17. The memory according to claim 1, wherein before data is written in the magnetoresistive element, data of the magnetoresistive element is read out.

18. The memory according to claim 1, further comprising a first write wiring line and a second write wiring line, which sandwich the magnetoresistive element, and
in which in writing data in the magnetoresistive element, the first and second write wiring lines are sequentially turned on, and one of the first and second write wiring lines, which has been turned on first, is turned off first.

19. The memory according to claim 1, wherein when the first magnetic coupling is anti-ferromagnetic coupling and the second magnetic coupling is ferromagnetic coupling, during no-current flow time, magnetization of the first ferromagnetic layer substantially equals composed magnetization of the second ferromagnetic layer and the third ferromagnetic layer.

20. The memory according to claim 1, wherein when the first magnetic coupling is ferromagnetic coupling and the second magnetic coupling is anti-ferromagnetic coupling, during no-current flow time, composed magnetization of the first ferromagnetic layer and the second ferromagnetic layer substantially equals magnetization of the third ferromagnetic layer.

* * * * *